United States Patent
Watanabe

(10) Patent No.: US 7,271,631 B2
(45) Date of Patent: Sep. 18, 2007

(54) CLOCK MULTIPLICATION CIRCUIT

(75) Inventor: Hideaki Watanabe, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/606,226

(22) Filed: Jun. 26, 2003

(65) Prior Publication Data

US 2004/0008060 A1    Jan. 15, 2004

(30) Foreign Application Priority Data

Jul. 1, 2002    (JP)    ............................. 2002-192559

(51) Int. Cl.
*H03B 19/00*    (2006.01)
(52) U.S. Cl. ........................ 327/115; 327/119; 327/120; 327/121; 327/122; 327/156; 375/373; 375/374; 375/375; 375/376; 377/47; 377/48
(58) Field of Classification Search ................ 327/116, 327/119–122, 156–159
See application file for complete search history.

(56) References Cited

U.S. PATENT DOCUMENTS

| | | | | |
|---|---|---|---|---|
| 4,017,719 A | * | 4/1977 | Kaplan et al. | ............... 708/101 |
| 5,317,283 A | * | 5/1994 | Korhonen | .................... 331/1 A |
| 5,982,208 A | * | 11/1999 | Kokubo et al. | ............. 327/119 |

* cited by examiner

*Primary Examiner*—Tuan T. Lam
*Assistant Examiner*—Hiep Nguyen
(74) *Attorney, Agent, or Firm*—Arent Fox LLP.

(57) ABSTRACT

A clock multiplication circuit simple in configuration, easy to adjust the characteristics thereof, and capable of shortening lockup time. The circuit delivers an output clock signal at a frequency that is a multiple of the frequency of a reference clock signal as inputted. A counter counts the number of rising edges of the output clock signal existing during a High level period of the reference clock signal, delivering a count value CN. A subtracter subtracts the count value from a reference value BN, delivering a difference value DN. An adder adds the difference value to a preceding integrated value, calculating a new integrated value. A DA converter delivers the analog control voltage corresponding to the integrated value. A VCO delivers the output clock signal at a frequency corresponding to the analog control voltage. The frequency of the output clock signal is controlled such that DN=BN−CN=0.

11 Claims, 23 Drawing Sheets

BLOCK DIAGRAM SHOWING CONFIGURATION OF CLOCK MULTIPLICATION CIRCUIT ACCORDING TO VARIATION 9

BLOCK DIAGRAM SHOWING CONFIGURATION OF CONVENTIONAL MULTIPLICATION PLL CIRCUIT

FIG. 2  BLOCK DIAGRAM SHOWING CONFIGURATION OF CLOCK MULTIPLICATION CIRCUIT ACCORDING TO EMBODIMENT 1

TIME CHART SHOWING ACTION OF RESPECTIVE COMPONENTS OF CLOCK MULTIPLICATION CIRCUIT ACCORDING TO EMBODIMENT 1

TIME CHART SHOWING ACTION OF RESPECTIVE COMPONENTS OF CLOCK MULTIPLICATION CIRCUIT ACCORDING TO VARIATION 1

TIME CHART SHOWING ACTION OF RESPECTIVE COMPONENTS OF CLOCK MULTIPLICATION CIRCUIT ACCORDING TO VARIATION 2

SCHEMATIC DIAGRAM ILLUSTRATING FLUCTUATION OF OUTPUT CLOCK SIGNAL AT TIME OF COUNTING RISING EDGES OF OUTPUT CLOCK SIGNAL FOR CONTROL

SCHEMATIC DIAGRAM ILLUSTRATING FLUCTUATION OF OUTPUT CLOCK SIGNAL AT TIME OF COUNTING BOTH RISING EDGES AND FALLING EDGES OF OUTPUT CLOCK SIGNAL FOR CONTROL ACCORDING TO VARIATION 3

BLOCK DIAGRAM SHOWING CONFIGURATION OF CLOCK MULTIPLICATION CIRCUIT ACCORDING TO EMBODIMENT 2

BLOCK DIAGRAM SHOWING CONFIGURATION OF CLOCK MULTIPLICATION CIRCUIT ACCORDING TO VARIATION 4

BLOCK DIAGRAM SHOWING CONFIGURATION OF CLOCK MULTIPLICATION CIRCUIT ACCORDING TO VARIATION 5

BLOCK DIAGRAM SHOWING CONFIGURATION OF CLOCK MULTIPLICATION CIRCUIT ACCORDING TO EMBODIMENT 3

SCHEMATIC DIAGRAM SHOWING CONFIGURATION OF SUBTRACTER OF CLOCK MULTIPLICATION CIRCUIT ACCORDING TO EMBODIMENT 3

FIG. 13 BLOCK DIAGRAM SHOWING CONFIGURATION OF CLOCK MULTIPLICATION CIRCUIT ACCORDING TO VARIATION 6

SCHEMATIC DIAGRAM SHOWING CONFIGURATION OF SUBTRACTER OF CLOCK MULTIPLICATION CIRCUIT ACCORDING TO VARIATION 6

FIG. 15 BLOCK DIAGRAM SHOWING CONFIGURATION OF CLOCK MULTIPLICATION CIRCUIT ACCORDING TO EMBODIMENT 4

FLOW CHART OF OPERATION SHOWING STEPS OF OBTAINING INITIAL INTEGRATED VALUE IN CASE OF CLOCK MULTIPLICATION CIRCUIT ACCORDING TO EMBODIMENT 4

FIG. 17

EXAMPLE OF STORING QUASI-INTEGRATED VALUE TOGETHER WITH QUASI-COUNT VALUE IN A REGISTER OF CLOCK MULTIPLICATION CIRCUIT ACCORDING TO EMBODIMENT 4

| ADDRESS | QUASI-INTEGRATED VALUE QIN | QUASI-COUNT VALUE QCN |
|---|---|---|
| 00h | 00000000 | 00000110 |
| 01h | 00000001 | 00000111 |
| 02h | 00000010 | 00001001 |
| 03h | 00000011 | 00001010 |
| ⋮ | ⋮ | ⋮ |
| FEh | 11111110 | 01101100 |
| FFh | 11111111 | 01101110 |

BLOCK DIAGRAM SHOWING CONFIGURATION OF CLOCK MULTIPLICATION CIRCUIT ACCORDING TO VARIATION 7

FLOW CHART OF OPERATION SHOWING STEPS OF OBTAINING INITIAL INTEGRATED VALUE IN CASE OF CLOCK MULTIPLICATION CIRCUIT ACCORDING TO VARIATION 7

BLOCK DIAGRAM SHOWING CONFIGURATION OF CLOCK MULTIPLICATION CIRCUIT ACCORDING TO VARIATION 8

BLOCK DIAGRAM SHOWING CONFIGURATION OF CLOCK MULTIPLICATION CIRCUIT ACCORDING TO VARIATION 9

BLOCK DIAGRAM SHOWING CONFIGURATION OF CLOCK MULTIPLICATION CIRCUIT ACCORDING TO VARIATION 10

BLOCK DIAGRAM SHOWING CONFIGURATION OF CLOCK MULTIPLICATION CIRCUIT ACCORDING TO EMBODIMENT 5

CLOCK MULTIPLICATION CIRCUIT

CROSS-REFERENCE TO RELATED APPLICATIONS

This application is based upon and claims the benefit of priority from each of the prior Japanese Patent Application No. 2002-192559 filed on Jul. 1, 2002, the entire contents of which are incorporated herein by reference.

BACKGROUND OF THE INVENTION

1. Field of the Invention

The invention relates to a clock multiplication circuit for converting a reference clock signal as inputted into an output clock signal having a frequency that is a multiple of the frequency of the reference clock signal.

2. Description of the Related Art

As a clock multiplication circuit using a reference clock signal as inputted for converting the reference clock signal into an output clock signal having a frequency that is a multiple of the frequency of the reference clock signal, there is known a multiplication PLL circuit. As the multiplication PLL circuit, there is known a multiplication PLL circuit 100 comprising, for example, a phase comparator circuit 110, a charge pump 120, a low pass filter (also referred to hereinafter merely as LPF) 130, a voltage control oscillator circuit (also referred to hereinafter merely as VCO) 140, and a frequency divider 150 as shown in FIG. 1. With the multiplication PLL circuit 100, the phase comparator circuit 110 compares the phase of a frequency-divided signal SD of the frequency divider 150 with that of a reference clock signal SR, and causes the charge pump 120 to deliver current corresponding to an up-signal and a down-signal, respectively, representing results of phase comparison, the current being integrated by the LPF 130 to be delivered as a voltage output. By inputting the voltage output to the VCO 140, an output clock signal ST at a frequency corresponding to the voltage output is delivered. The frequency divider 150 divides the frequency of the output clock signal ST. Thus, there is delivered the output clock signal ST at a frequency that is a multiple M, which is the reciprocal of a frequency-dividing ratio (1/M), of the frequency of the reference clock signal SR. Further, accuracy of the frequency of the output clock signal ST can be maintained by executing the phase comparison for PLL control once in every cycle of the reference clock signal SR.

With the multiplication PLL circuit 100, however, the up-signal or the down-signal, having a pulse width corresponding to a phase difference between the frequency-divided signal SD and the reference clock signal SR, is delivered from the phase comparator circuit 110, and these signals are processed in an analog fashion, thereby controlling the frequency of the VCO 140. Accordingly, in order to adjust a loop gain and other circuit characteristics of the multiplication PLL circuit so as to be in a proper state, it has been necessary to adjust the characteristics of analog circuits such as the phase comparator circuit 110, charge pump 120, LPF 130, VCO 140, frequency divider 150, and so forth, which is inconvenient. Furthermore, there have been user requests for shortening lockup time.

SUMMARY OF THE INVENTION

In view of such problems as described, the invention has been developed, and it is an object of the invention to provide a clock multiplication circuit of a simple configuration.

It is another object of the invention to provide a clock multiplication circuit whose characteristics can be adjusted with ease. Further, it is still another object of the invention to provide a clock multiplication circuit in which lockup time can be shortened.

Then, means for resolving the problem is a clock multiplication circuit for converting a reference clock signal as inputted into an output clock signal having a frequency that is a multiple of the frequency of the reference clock signal, and the clock multiplication circuit comprises: a counter for delivering a count value by counting the number of effective transition edges of the output clock signal, existing during a predetermined counting period given on the basis of the reference clock signal; a subtracter for delivering a difference value obtained by subtracting either the count value or a reference value from the other; a control voltage generation circuit for delivering an analog control voltage corresponding to an integrated value of the difference value; and a voltage control oscillator circuit for delivering the output clock signal at a frequency corresponding to the analog control voltage.

With the clock multiplication circuit according to the invention, the difference value is calculated by use of numerical data (digital value), which is called the count value, and further, the analog control voltage is generated. Thus, since processing of values (digital values) is possible, a simple configuration of the circuit will suffice, and processing can be executed with ease. Further, since numerical processing of the numerical data, such as addition, subtraction, multiplication, division, etc., can be easily executed, the characteristics of the clock multiplication circuit can be adjusted with greater ease as compared with the case of executing processing of signals with an analog circuit.

The operation principle of the clock multiplication circuit is briefly described hereinafter. It is assumed that use is made of a VCO wherein a difference value is obtained by subtracting a count value from a reference value, having the V-f characteristics thereof with a positive tilt, that is, the characteristics such that the frequency of the output clock signal ST becomes higher according as the analog control voltage is increased.

First, suppose that, with this clock multiplication circuit, the frequency of the output clock signal ST is, for some reason, lower than that for the case where the frequency is at a proper value. In such a case, a count value will become smaller in comparison with a count value that would be obtained if the frequency of the output clock signal ST were at a proper value, so that a difference value obtained by subtracting the count value from the reference value will be a positive value. Hereupon, an analog control voltage corresponding to an integrated value of the difference value will become larger. Accordingly, the frequency of an output clock signal from the VCO is controlled so as to be changed towards a higher direction. That is, the frequency of the output clock signal will be corrected in a direction causing the frequency to approach the proper value.

On the other hand, if the frequency of the output clock signal is on the higher side of the proper value, the count value will become larger than that for the case where the frequency is at the proper value, so that the difference value obtained by subtracting the count value from the reference value will be a negative value. Hereupon an analog control voltage corresponding to an integral value of the difference value will become smaller. As a result, the output clock signal from the VCO is controlled towards a direction causing the frequency to become lower. That is, in this case as well, the frequency of the output clock signal is corrected in a direction causing the frequency to approach the proper value.

Thus, with the clock multiplication circuit, the output clock signal is controlled such that the frequency thereof becomes the proper value, in other words, the count value becomes the proper value. More specifically, with the clock multiplication circuit, control is implemented such that a difference between the reference value and the count value becomes 0, that is, the reference value becomes equal to the count value.

In the present specification, an effective transition edge refers to an edge (suddenly changing part) of a signal, taken as effective in counting, among the edges of the signal, appearing at the time when the signal undergoes reversal in its level, rising from a Low level to a High level or falling from the High level to the Low level. When using, for example, a signal in rectangular waveform, if rising edges of the signal are counted, but falling edges thereof are not counted, only the rising edges, among the rising edges and falling edges of the signal, are taken as the effective transition edges. Conversely, if the falling edges of the signal are counted, but the rising edges thereof are not counted, the falling edges are taken as the effective transition edge. Further, if the falling edges of the signal also are counted while the rising edges thereof are counted, both the rising edges and the falling edges are taken as the effective transition edges.

Further, a counting period refers to a time period during which the number of the existing effective transition edges is counted by the counter.

The predetermined counting periods given on the basis of the reference clock signal include, for example, the followings: (1) a High level period of the reference clock signal; (2) a Low level period of the reference clock signal; (3) the High level period and Low level period of the reference clock signal; (4) one cycle of the reference clock signal (a time period from a rise timing of the reference clock signal until the next rise timing thereof, or a time period from a fall timing of the reference clock signal until the next fall timing thereof); (5) m-cycles of the reference clock signal (m: an integer equal to or larger than 2), that is, a time period equivalent to a plurality of pairs of the High level periods and Low level periods; (6) m-cycles of the reference clock signal (m=an integer equal to or not less than 2)+the High level period preceding thereto or succeeding therefrom, that is, a time period equivalent to (m+1)×the High level period+ m×the Low level period, corresponding to (m+½) cycles of the reference clock signal in case of a duty ratio of the reference clock signal being 50%; and (7) m-cycles of the reference clock signal (m=an integer equal to or not less than 2)+the Low level period preceding thereto or succeeding therefrom, that is, a time period equivalent to m×the High level period+(m+1)×the Low level period.

Further, with a subtracter, there can be either case where the count value is subtracted from the reference value or a case where the reference value is subtracted from the count value. Adoption of either of these cases is determined as appropriate such that the clock multiplication circuit operates properly, depending on the characteristics of the VCO, the method of processing at a control voltage generation circuit, and so forth.

For the control voltage generation circuit, it is possible to adopt, for example, either a type with the V-f characteristic having a positive tilt or a type with the V-f characteristic having a negative tilt. Adoption of either of these types is determined as appropriate such that the clock multiplication circuit operates properly, depending on the characteristics of the subtracter, the method of processing at the control voltage generation circuit, and so forth.

Herein, the High level period refers to a time period during which the reference clock signal stays at the High level while the Low level period refers to a time period during which the reference clock signal stays at the Low level.

Further, in the present specification, any means capable of obtaining a proper initial integrated value may be used as initial integrated value acquisition means, including, for example, means for pre-obtaining a relationship between the integrated value and the count value by counting the count values when the integrated value is varied, storing the relationship, and using the integrated value when the count value becomes a value equal to or sufficiently close to the reference value as an initial integrated value. Otherwise, there may be included means for searching for the integrated value when the count value becomes a value equal to or sufficiently close to the reference value by varying the integrated value as appropriate, and using the same as an initial integrated value. Also, there may be included means for storing in a nonvolatile memory the integrated value when the count value becomes a value equal to or sufficiently close to the reference value, and the clock multiplication circuit is operating with a multiple as desired, and using the same as an initial integrated value for the next operation.

The above and further objects and novel features of the invention will be more fully appear from the following detailed description when the same is read in connection with the following drawings. It is to be expressly understood, however, that the drawings are for the purpose of illustration only and are not intended as a definition of the limits of the invention.

BRIEF DESCRIPTION OF THE DRAWINGS

FIG. 17 is a view showing an example of storing a quasi-integrated value together with a quasi-count value in a register of the clock multiplication circuit according to the embodiment 4;

DETAILED DESCRIPTION OF THE PREFERRED EMBODIMENTS

Embodiment 1

Figure 1:
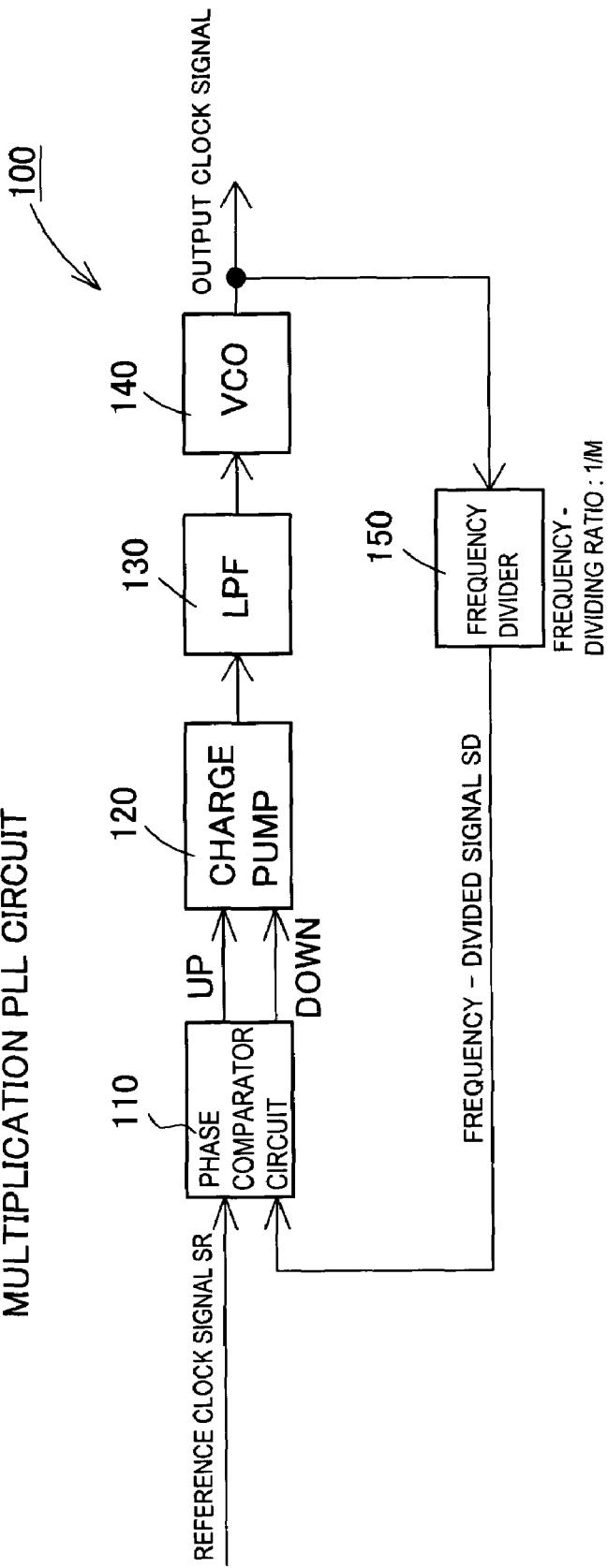
FIG. 1 is a block diagram showing the configuration of a conventional multiplication PLL circuit.

An embodiment 1 of the invention is described hereinafter with reference to FIGS. 2 and 3. A clock multiplication circuit 1 according to the embodiment 1 of the invention is a circuit for converting a reference clock signal SR as inputted into an output clock signal ST having a frequency that is a multiple M of the frequency of the reference clock signal SR. The clock multiplication circuit 1 has a counter 2 for counting the number of rising edges of the output clock signal ST, existing during a High level period when the reference clock signal SR as inputted has stayed at a High level. Further, the clock multiplication circuit 1 has an oscillation control circuit 8 and a voltage control oscillator circuit 7. The oscillation control circuit 8 controls the frequency of the output clock signal ST delivered from the VCO 7 such that a count value CN as counted by the counter 2 remains constant. More specifically, the clock multiplication circuit 1 comprises a subtracter 3, and an analog control voltage generation circuit 4 besides the counter 2 and the VCO 7. Further, the analog control voltage generation circuit 4 comprises an adder 5 and a DA converter circuit (also referred to hereinafter merely as DAC) 6.

As described above, the counter 2 counts the number of the rising edges of the output clock signal ST during the High level period of the reference clock signal SR. Then, in synchronization with the end of the High level period described and the output clock signal ST, the count value CN is delivered. In FIG. 3, after counting the number of rising edges of the output clock signals ST, indicated by the upward oriented arrows ↑ shown in the figure, existing during, for example, a first High level period T1, and in synchronization with the end of the High level period T1 and the output clock signal ST, a count value CN1 is delivered.

Subsequently, in synchronization with the end of the High level period described and the output clock signal ST, the subtracter 3 subtracts the count value CN, as inputted, from a reference value BN retained internally, thereby delivering a difference value DN(=BN−CN). In FIG. 3, in synchronization with a succeeding rising edge of the output clock signal ST as seen from, for example, a time when a count value CN1 is delivered, a difference value DN1 is calculated and delivered.

Hereupon, in synchronization with the end of the High level period described and the output clock signal ST, the adder 5 adds the difference value DN as inputted to an integrated value IN retained internally, thereby obtaining a new integrated value IN (=IN+DN), which is delivered. In FIG. 3, in synchronization with a succeeding rising edge of the output clock signal ST as seen from, for example, a time when the difference value DN1 is delivered, an integrated value IN1 is calculated and delivered. In this connection, the adder 5 is provided with an initial value of the integrated value IN (an initial integrated value) beforehand.

Subsequently, in synchronization with the end of the High level period described and the output clock signal ST, the DAC 6 converts the integrated value IN as inputted into an analog control voltage AV corresponding thereto, thereby delivering the analog control voltage AV. In FIG. 3, in synchronization with a succeeding rising edge of the output clock signal ST as seen from, for example, a time when the integrated value IN1 is delivered, an analog control voltage AV1 is delivered.

Hereupon, at VCO7, the frequency of the output clock signal ST as delivered is changed so as to correspond to the analog control voltage AV as inputted. It follows therefore that a count value CN as counted by the counter 2 during a succeeding High level period of the reference clock signal is changed. In FIG. 3, the frequency of the output clock signal ST is changed to a frequency relatively lower than before due to, for example, the effect of the analog control voltage AV1. As a result, a count value CN2 as counted in a succeeding High level period T2 becomes smaller than the count value CN1 in the preceding High level period. Thereafter, a difference value DN2 and an integrated value IN2 are similarly calculated, and an analog control voltage AV2 is obtained, whereupon the frequency of the output clock signal ST is again changed.

Now, the operation principle of the clock multiplication circuit 1 is described hereinafter. It is assumed that the V-f characteristics of the VCO 7 is monotonous and nearly linear, having further a positive tilt. That is, it is assumed that use is made of the VCO having characteristics such that the frequency of the output clock signal ST becomes higher according as the analog control voltage AV is increased.

On the assumption described, suppose that the frequency of the output clock signal ST is, for some reason, lower than that for the case where the frequency is at a proper value. In such a case, a count value CN actually obtained will become smaller in comparison with a count value CN that would be obtained if the frequency of the output clock signal ST were at a proper value. Hereupon, a difference value DN (=BN−CN) obtained by subtracting the count value CN from the reference value BN will become larger in comparison with the difference value DN that would be obtained if the frequency of the output clock signal ST were at the proper value. Accordingly, an integrated value IN obtained by adding such a difference value DN to the integrated value IN retained internally will also become larger in comparison with an integrated value that would be obtained if the frequency of the output clock signal ST were at the proper value. Since the DAC 6 delivers an analog control voltage AV corresponding to the integrated value IN, the analog control voltage AV1 becomes relatively higher in the end. Thus, the frequency of the output clock signal ST from the VCO is rendered higher than the present one. That is, the frequency of the output clock signal ST that has been on the lower side will be corrected in a direction causing the frequency to approach the proper value.

Conversely, suppose that the frequency of the output clock signal ST is, for some reason, higher than that for the case where the frequency is at the proper value. In such a case, a count value CN actually obtained will become larger in comparison with the count value CN that would be obtained if the frequency of the output clock signal ST were at the proper value. Hereupon, a difference value DN (=BN−CN) obtained by subtracting the count value CN from the reference value BN will become smaller in comparison with the difference value DN that would be obtained if the frequency of the output clock signal ST were at the proper value. Accordingly, an integrated value IN obtained by adding such a difference value DN to the integrated value IN retained internally will also become smaller in comparison with an integrated value that would be obtained if the frequency of the output clock signal ST were at the proper value. Since the DAC 6 delivers an analog control voltage AV corresponding to the integrated value IN, the analog control voltage AV1 becomes relatively lower in the end. Thus, the frequency of the output clock signal ST from the VCO is rendered lower than the present one. That is, the frequency of the output clock signal ST that has been on the higher side will be corrected in a direction causing the frequency to approach the proper value.

The clock multiplication circuit 1 controls the frequency of the output clock signal ST so as to be at the proper value in this manner. More specifically, with the clock multiplication circuit 1, the frequency is controlled such that the integrated value IN (=IN+DN) remains constant, and further, the difference value DN becomes zero (=DN=BN−CN).

As described above, in the case of DN=BN−CN=0, in other words, in the case where control is made such that the count value CN is equal to the reference value BN (CN=BN), a multiple M of the clock multiplication circuit 1 is represented by the product of the reciprocal of a proportion (high duty ratio HD) of the High level periods, which are the counting periods according to the first embodiment, to one cycle period of the reference clock signal SR, and the reference value BN.

That is, M=BN/HD

For example, if the high duty ratio HD is 50%, M=2·BN is established. Conversely, on the basis of BN=M·HD, it is possible to obtain the output clock signal ST having a frequency that is a multiple M of the frequency of the reference clock signal SR.

In this connection, the high duty ratio HD is given by the following formula:

$$HD=th/(th+td)$$

where "th" is a High level pulse width of the reference clock signal SR, and "td" is a Low level pulse width thereof.

With the clock multiplication circuit 1, the difference value DN and further, the integrated value IN are calculated by use of numerical data, which is called the count value CN, and thereafter, the analog control voltage AV is generated through DA conversion. Thus, with the clock multiplication circuit 1, the numerical data are processed, and furthermore, the processing of the numerical data itself requires only simple processing, such as addition, subtraction, and so forth, so that a simple configuration thereof will suffice.

Further, since the count value CN, the difference value DN, and the integrated value IN are numerical data, the processing of numerical values, such as multiplication, addition of offset values, and so forth, can be executed with ease. Accordingly, the present embodiment is advantageous in that the characteristics of the clock multiplication circuit 1 can be adjusted with ease as compared with the case of executing processing of signals with an analog circuit such as the previously described multiplication PLL circuit.

With the clock multiplication circuit 1 according to the embodiment 1, the adder 5 for obtaining the integrated value IN is interposed between the subtracter 3 and the DAC 6. The adder 5 adds a difference value DN to a preceding integrated value IN, thereby obtaining a new integrated value IN (=IN+DN), so that the adder 5 has a value representing difference values DN from the past up to the present time, added up, thereby serving as a low-pass filter that takes out low frequency components of variations in the difference values DN. Upon inputting a difference value DN to the DAC 6 without use of the adder 5, the frequency of the output clock signal ST undergoes a significant change in every cycle period of the reference clock signal SR when the difference value DN is obtained, thereby becoming prone to occurrence of a hunting phenomenon. In contrast, with the clock multiplication circuit 1 according to the embodiment 1, using the adder 5, even if the difference value DN undergoes a sudden change, the integrated value IN does not undergo much change, so that the frequency of the output clock signal ST does not undergo a sudden change, thereby enabling the hunting phenomenon to be inhibited.

Figure 3:
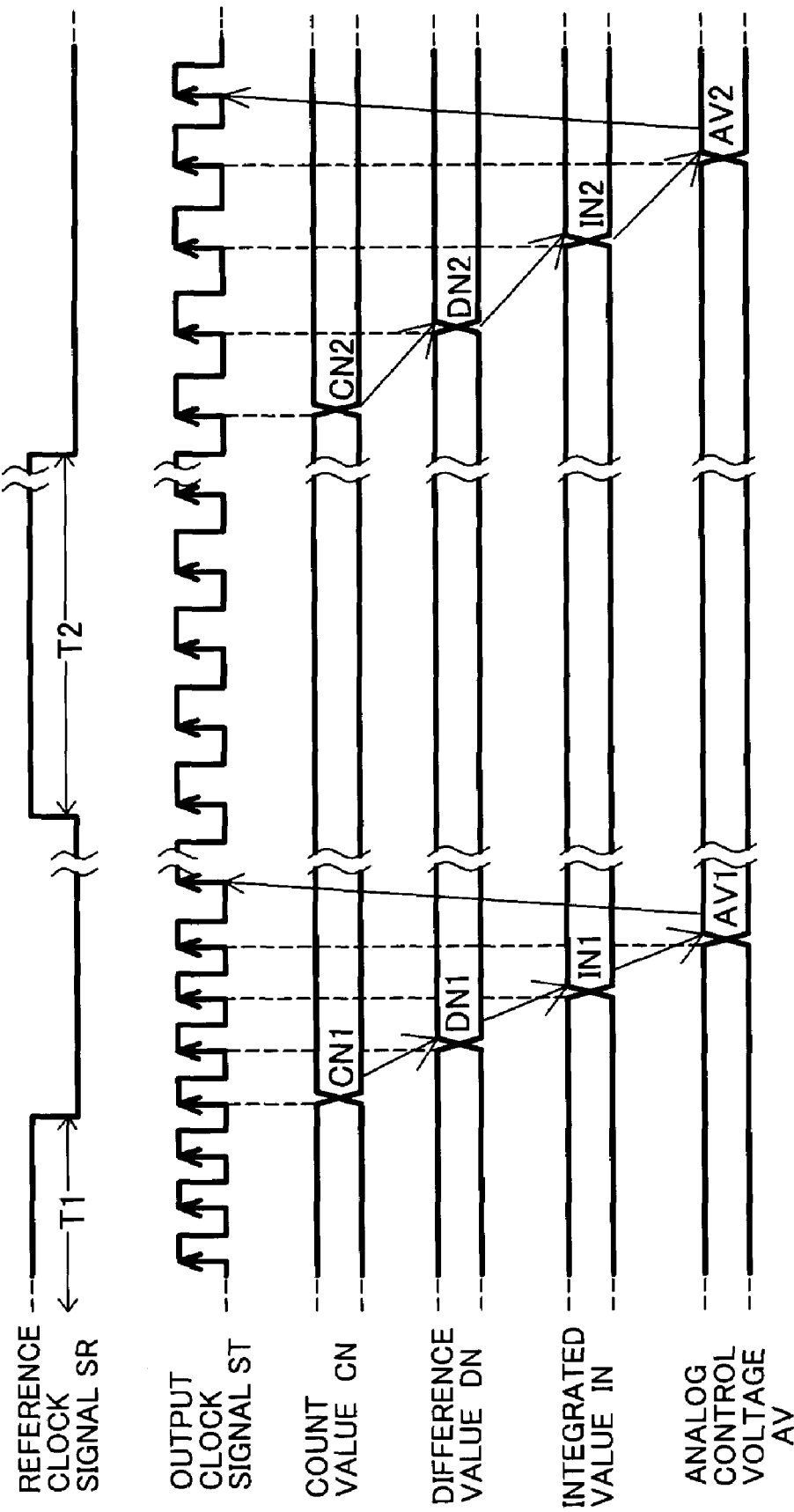
FIG. 3 is a time chart showing the action of respective components of the clock multiplication circuit according to the embodiment 1.

Further, with the embodiment 1, as shown in FIG. 3, there are obtained in sequence the difference value DN1, the integrated value IN1, and the analog control voltage AV1 one after another in synchronization with the respective rising edges of the output clock signal ST for every cycle of the output clock signal ST after the end of the High level period T1. That is, the clock multiplication circuit 1 is configured such that the analog control voltage AV1 is obtained after four cycles of the output clock signal ST following the end of the High level period T1, thereby changing the frequency of the output clock signal ST delivered from the VCO 7. However, since similar results can be obtained if the frequency of the output clock signal ST can be changed in time for the next High level period T2, it is possible to adopt a counter 2, a subtracter 3, etc. configured such that time for several clocks is required from input to output in case of a multiple M (or a reference value BN) as adopted being large in value.

As can be understood with ease, with the clock multiplication circuit 1 according to the embodiment 1, the High level periods of the reference clock signal SR are the counting periods, respectively, and the rising edges of the output clock signal ST are the effective transition edges, respectively.

(Variation 1)

With the embodiment 1, the number of the rising edges of the output clock signal ST, existing during the High level period when the reference clock signal SR is at the High level, is counted by the counter 2.

Figure 2:
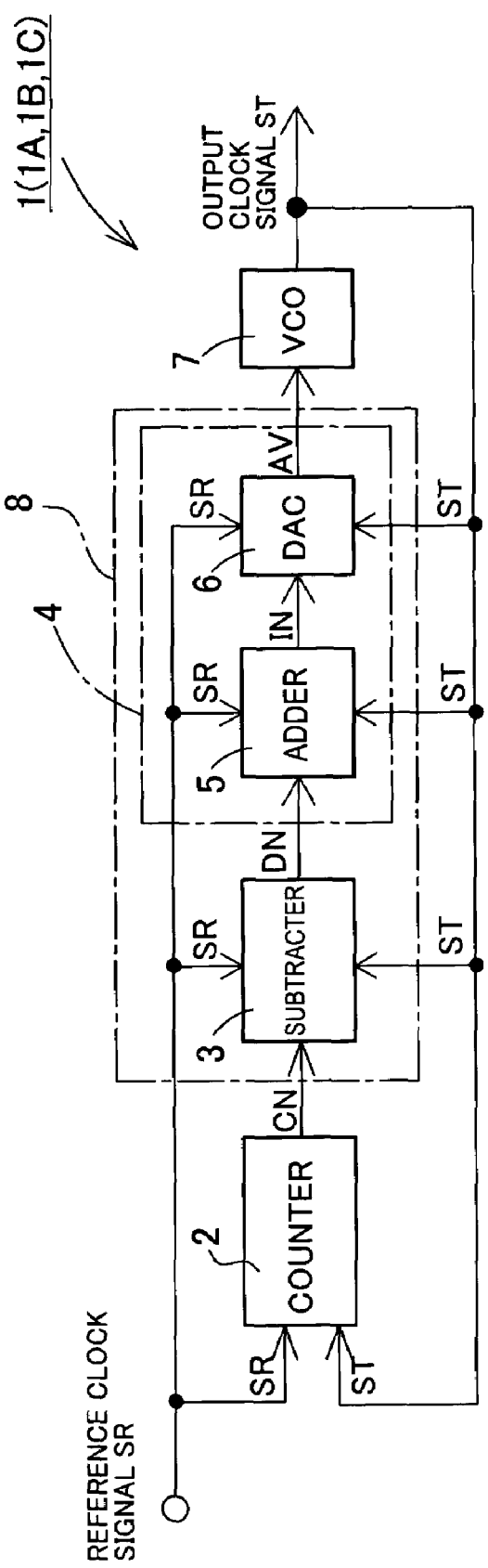
FIG. 2 is a block diagram showing the configuration of an embodiment 1 of a clock multiplication circuit according to the invention.
Figure 4:
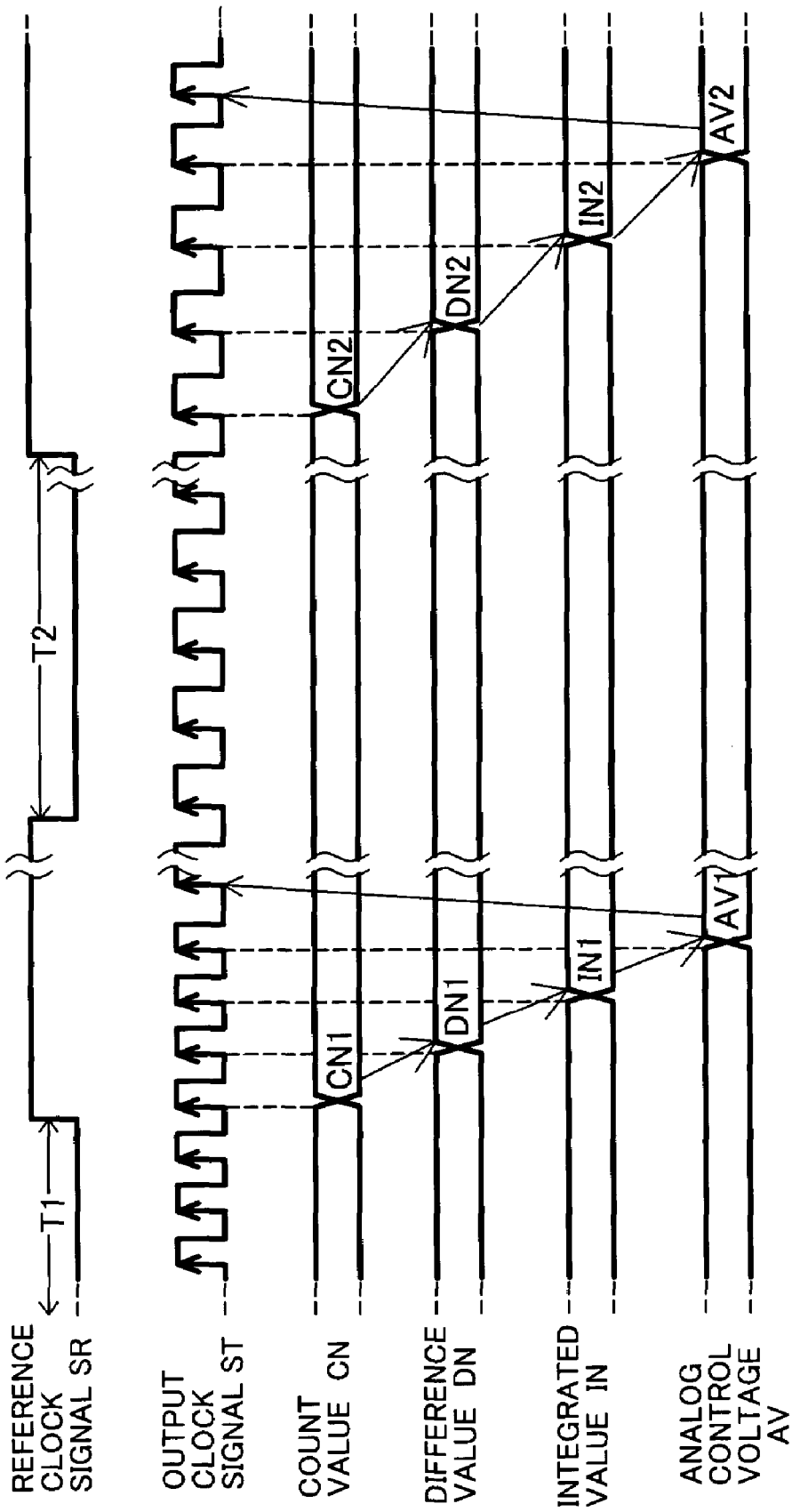
FIG. 4 is a time chart showing the action of respective components of the clock multiplication circuit according to a variation 1.

Meanwhile, a clock multiplication circuit 1A according to a variation 1 has a circuit configuration similar to that for the clock multiplication circuit 1 according to the embodiment 1 (refer to FIG. 2). As shown in a time chart of FIG. 4, however, the clock multiplication circuit 1A differs from the clock multiplication circuit 1 in that a count value CN is obtained by counting the number of rising edges of an output clock signal ST existing during Low level periods T1, T2, respectively, when a reference clock signal SR is at a Low level by use of a counter 2. That is, with the clock multiplication circuit 1A, a count value CN1 is obtained by counting the number of the rising edges of the output clock signal ST, existing during the Low level period T1 and thereafter, as with the embodiment 1, a difference value DN1 (=BN−CN1) and an integrated value IN1 (=IN0+DN1), are obtained.

Even in this case, as with the case of the embodiment 1, the frequency can be controlled such that the integrated value IN (=IN+DN) remains at a given value, and further, the difference value DN becomes zero (=DN=BN−CN), thereby obtaining similar advantageous effects.

(Variation 2)

With the embodiment 1 and the variation 1, the number of the rising edges of the output clock signal ST, existing during either the High level period or the Low level period, when the reference clock signal SR is at either the High level or the Low level, is counted by a counter 2.

Figure 5:
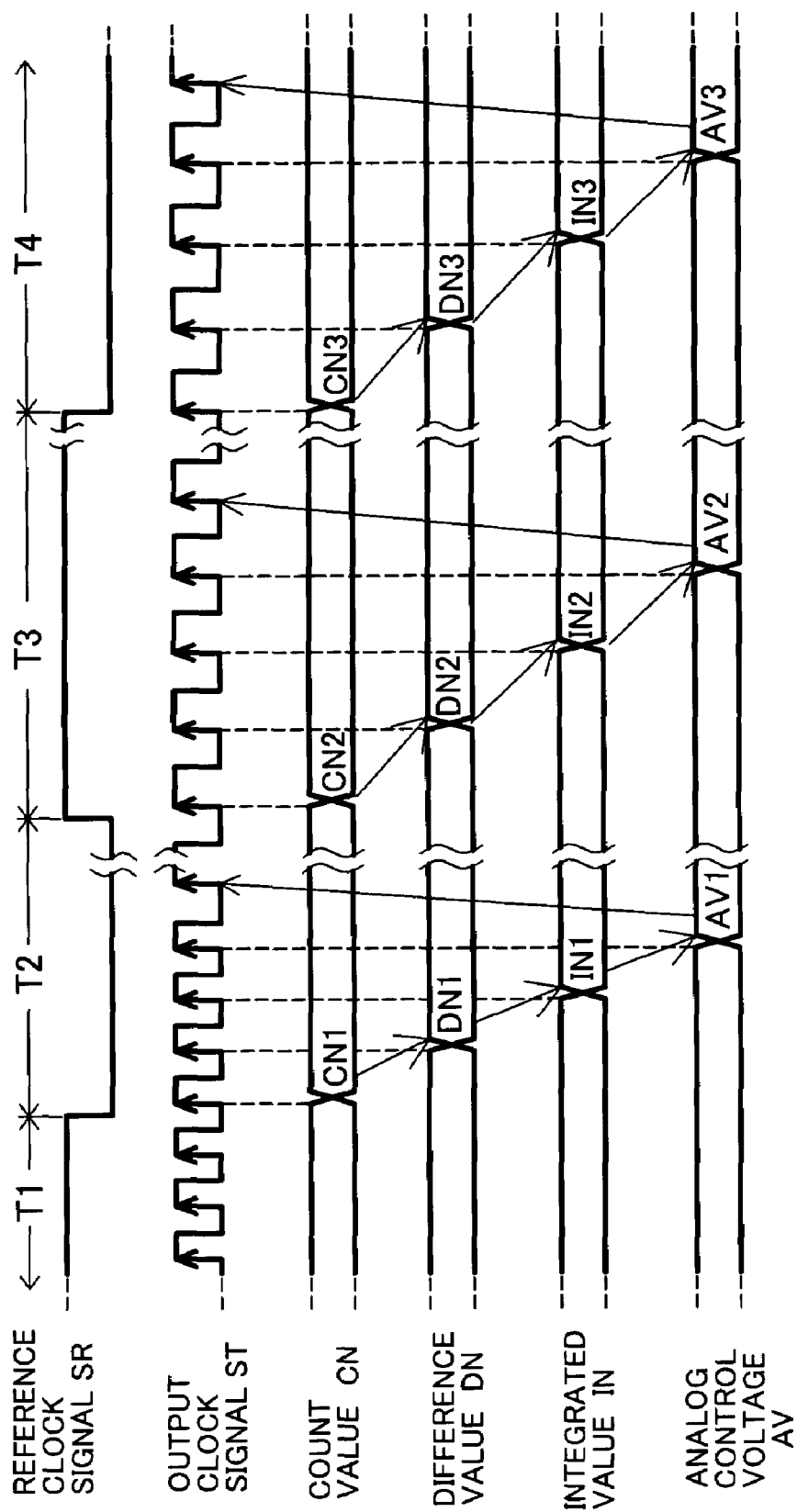
FIG. 5 is a time chart showing the action of respective components of the clock multiplication circuit according to a variation 2.

Meanwhile, a clock multiplication circuit 1B according to a variation 2 as well has a circuit configuration similar to that for the clock multiplication circuit 1 according to the embodiment 1 (refer to FIG. 2). As shown in a time chart of FIG. 5, however, the clock multiplication circuit 1B differs from the embodiment 1 and the variation 1 in that a count value CN is obtained by counting the number of rising edges of an output clock signal ST existing during High level periods T1, T3, when a reference clock signal SR is at a High level and during Low level periods T2, T4, when the reference clock signal SR is at a Low level, by use of a counter 2, respectively. The reference clock signal SR has a duty ratio of 50%.

That is, with the clock multiplication circuit 1B, a count value CN1 is obtained by counting the number of the rising edges of the output clock signal ST, existing during a High level period T1, and thereafter, as with the embodiment 1, a difference value DN1, an integrated value IN1, and an analog control voltage AV1 are obtained. Meanwhile, the counter 2 delivers the count value CN1 during a Low level period T2, and at the same time, counts the number of the rising edges existing during the Low level period T2, thereby obtaining CN2. Further, the counter 2 delivers the count value CN2 during a High level period T3, and at the same time, counts the number of the rising edges existing during a High level period T3, thereby obtaining CN3. Thus, the counter 2 is set to deliver the count value CN for the High level periods T1, T3 . . . , and the Low level periods T2, T4, . . . , respectively.

As a result, an analog control voltage AV can be obtained twice for every cycle of the reference clock signal SR, thereby controlling the frequency of the output clock signal ST delivered from the VCO 7. In other words, with the clock multiplication circuit 1B as well, the frequency of the output clock signal ST can be controlled in spite of its simple configuration. Further, since numerical data are processed, the characteristics of the circuit can be adjusted with ease.

Further, as with the case of the embodiment 1, the frequency can be controlled such that an integrated value IN (=IN+DN) remains a given value, and further, a difference value DN becomes zero (=DN=BN−CN).

Still further, as described above, with the clock multiplication circuit 1B according to the variation 2, the frequency of the output clock signal ST is controlled twice for every cycle of the reference clock signal SR. Accordingly, jitter can be suppressed to about half in comparison with that for the clock multiplication circuit 1 etc. according to the embodiment 1 and the variation 1.

As can be understood with ease, with the clock multiplication circuit 1B according to the variation 2, both the High level periods and the Low level periods of the reference clock signal SR are counting periods, respectively, (Variation 3)

Now, with any of the clock multiplication circuits according to the embodiment 1, and the variations 1, 2, the number of the rising edges of the output clock signal ST, existing during respective time periods such as the High level period T1, and so forth, is counted by the counter 2. Accordingly, even if control is made such that n/2 occurrences (for example, 16 occurrences) of the rising edges of the output clock signal ST exist during, for example, a High level period T, as indicated by the upward oriented arrows ↑ shown in FIG. 6, tolerance in the frequency of the output clock signal ST is permissible to some extent in the strict sense.

FIG. 6A shows a case where the frequency of the output clock signal ST is at the lowest within the maximum permissible range. In this case, there occur the first rising edge of the output clock signal ST immediately after the start of the High level period T, and the (n/2)-th rising edge of the output clock signal ST immediately before the end of the High level period T. It follows that the output clock signals ST corresponding to nearly ((n/2)−1) cycles have existed during the High level period T in this case.

On the other hand, FIG. 6B shows a case where the frequency of the output clock signal ST is at the highest within the maximum permissible range. In this case, there occurs the first rising edge of the output clock signal ST at a time after the elapse of nearly one cycle period of the output clock signal ST from the start of the High level period T. Then, there occurs the (n/2)-th rising edge of the output clock signal ST nearly one cycle period of the output clock signal ST before the end of the High level period T. It follows that the output clock signals ST corresponding to nearly ((n/2)+1) cycles have existed during the High level period T in this case.

Accordingly, as can be easily understood by comparing FIG. 6A with FIG. 6B, variation corresponding to ±1.0 cycle in terms of cycles existing within the High level period T is permissible as for the output clock signal ST. That is, it is shown that there exists fluctuation in the frequency of the output clock signal ST, corresponding to ±1.0 cycle, during the High level period T. Such fluctuation has a direct bearing on the magnitude of jitter in the case of the clock multiplication circuit 1 according to the embodiment 1, and so forth.

Figure 7:
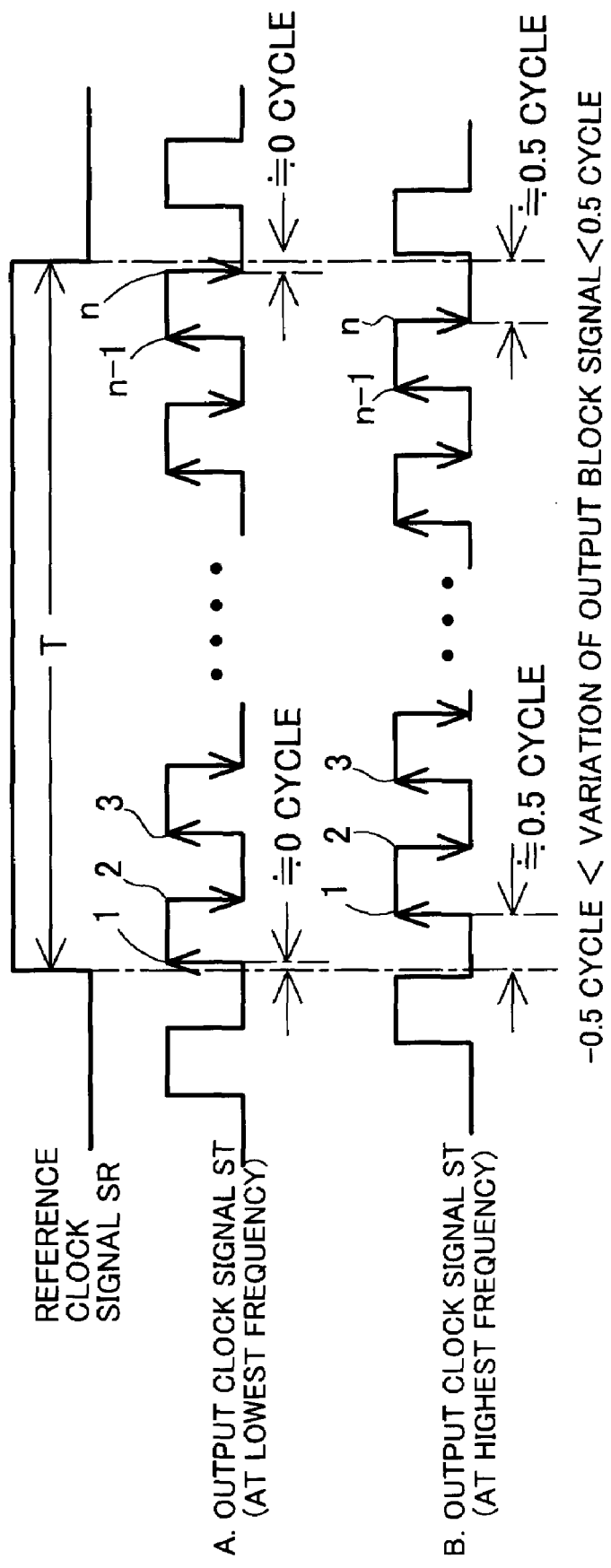
FIG. 7 is a schematic diagram illustrating fluctuation of an output clock signal at the time of counting both rising edges and falling edges of the output clock signal for control according to a variation 3.

Now, a clock multiplication circuit 1C according to a variation 3 is described hereinafter. The clock multiplication circuit 1C according to the variation 3 as well has a circuit configuration similar to that for the clock multiplication circuit 1 according to the embodiment 1 (refer to FIG. 2). With the clock multiplication circuit 1C, however, there are counted both rising edges and falling edges of an output clock signal ST, existing during the High level period T of a reference clock signal SR, as indicated by the upward oriented arrows ↑ and the downward oriented arrows ↓, respectively, as shown in a time chart of FIG. 7.

In the case of controlling the output clock signal ST such that n occurrences (for example, 32 occurrences) of the rising edges and the falling edges of the output clock signal ST exist during the High level period T, a tolerance range of the frequency of the output clock signal ST is described hereinafter. Incidentally, the reference clock signal SR is assumed to have a duty ratio of 50%.

FIG. 7A shows a case where the frequency of the output clock signal ST is at the lowest within the maximum permissible range. In this case, there occur the first edge (rising edge) of the output clock signal ST immediately after the start of the High level period T, and the n-th edge (falling edge) of the output clock signal ST immediately before the end of the High level period T. It follows that the output clock signals ST corresponding to nearly $((n/2)-(\frac{1}{2}))$ cycles have existed during the High level period T in this case.

On the other hand, FIG. 7B shows a case where the frequency of the output clock signal ST is at the highest within the maximum permissible range. In this case, there occurs the first edge (rising edge) of the output clock signal ST at a time after the elapse of nearly 0.5 cycle of the output clock signal ST from the start of the High level period T. Then, there occurs the n-th edge (falling edge) of the output clock signal ST nearly 0.5 cycle of the output clock signal ST before the end of the High level period T. It follows that the output clock signals ST corresponding to nearly $((n/2)+(\frac{1}{2}))$ cycles have existed during the High level period T in this case.

Accordingly, as can be easily understood by comparing FIG. 7A with FIG. 7B, variation corresponding to ±0.5 cycle in terms of cycles existing within the High level period T is permissible as for the output clock signal ST. That is, it is shown that there exist fluctuation in the frequency of the output clock signal ST, corresponding to ±0.5 cycle only during the High level period T. Also, it is shown that the fluctuation has been reduced to about half of that in the case of the clock multiplication circuit 1 according to the embodiment 1, and so forth. Thus, it is apparent that, with the clock multiplication circuit 1C according to the variation 3, jitter is suppressed to about half of that for the embodiment 1, and so forth.

Embodiment 2

Figure 8:
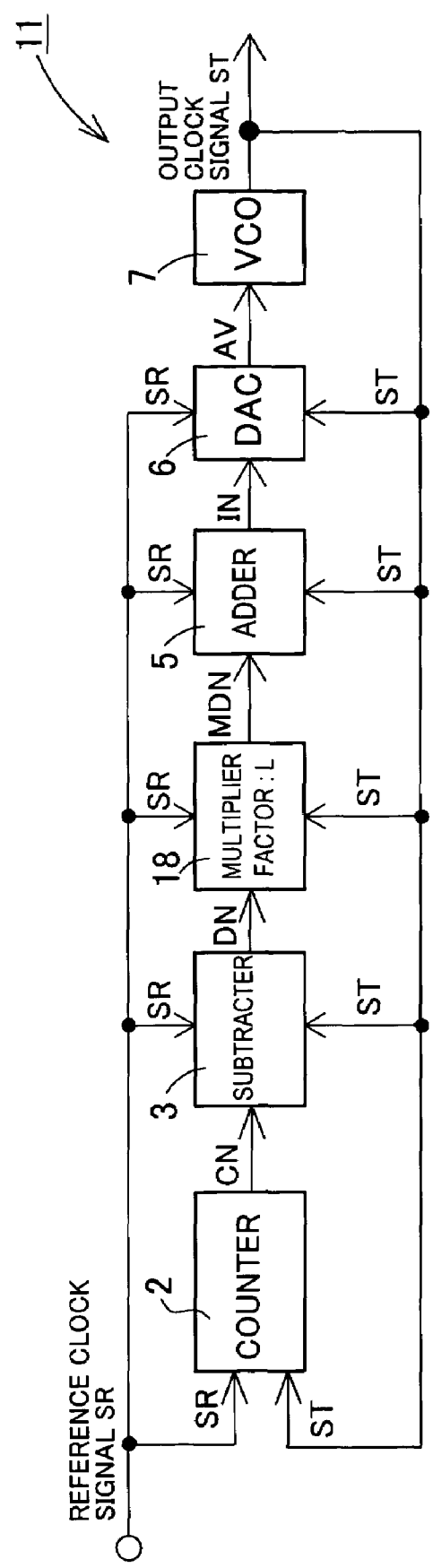
FIG. 8 is a block diagram showing the configuration of an embodiment 2 of a clock multiplication circuit according to the invention.

An embodiment 2 of a clock multiplication circuit 11 according to the invention is described hereinafter with reference to FIG. 8. The clock multiplication circuit 11 according to the embodiment 2 comprises a counter 2, a subtracter 3, an adder 5, a DAC 6, and a VCO 7 as with the clock multiplication circuit 1 according to the embodiment 1, and in addition, has a multiplier 18 interposed between the subtracter 3 and the adder 5, for multiplying a difference value DN by a predetermined factor L, and delivering a multiplied difference value MDN to the adder 5.

If the factor L of the multiplier 18 is larger than 1, a change in magnitude of the difference value DN, accordingly, a change in a count value CN will have a large effect on a change in an integrated value IN and a change in an analog control voltage AV, and finally on the frequency of an output clock signal ST. That is, it is possible to increase a loop gain of the clock multiplication circuit 11. Conversely, if the factor L of the multiplier 18 is less than 1, it is possible to check a loop gain of the clock multiplication circuit 11.

By increasing the factor L to thereby increase the loop gain of the clock multiplication circuit 11, response characteristics are enhanced, so that the frequency of the output clock signal ST can be sensitively controlled upon occurrence of even a slight change in the count value CN. Further, lockup time also can be shortened. On the other hand, by decreasing the factor L to thereby curb the loop gain of the clock multiplication circuit 11, it is possible to reduce the risk of frequency control getting out of tolerance due to a sensitive change in the frequency of the output clock signal ST, caused by a change in the count value CN, resulting from a slight external disturbance.

Further, with the clock multiplication circuit 11 according to the embodiment 2, by obtaining the multiplied difference value MDN after multiplying the difference value DN by the predetermined factor L, the loop gain of the clock multiplication circuit 11 can be adjusted. Thus, with the clock multiplication circuit 11, since numerical values (digital values) instead of analog signals are used in processing, the loop gain can be adjusted with ease simply by multiplying the difference value DN, which is a digital value, by the factor L to thereby obtaining the multiplied difference value MDN.

If a shift register for implementing bit shift of the difference value DN that is binary data by predetermined bits so as to be rendered $2^S$-fold (S is a plus or minus integer) is adopted as the multiplier 18 with the factor L, it will be easy to make up the multiplier 18.

(Variation 4)

With the embodiment 2 described above, the clock multiplication circuit 11 comprising the multiplier 18 with the fixed factor L is described by way of example. A clock multiplication circuit 21 (refer to FIG. 9) according to a variation 4 as well has a circuit configuration similar to that for the clock multiplication circuit 11 according to the embodiment 2, but differs from the latter in that the clock multiplication circuit 21 comprises a multiplier 28 capable of switching its factor between L1 and L2 (L1>L2).

That is, with the clock multiplication circuit 21 according to the variation 4, during a lock-in period from after powering on the clock multiplication circuit 21 until stabilization of the frequency of an output clock signal ST at a predetermined value, use is made of a relatively high factor L1. On the other hand, after the elapse of the lock-in period, use is made of a relatively low factor L2. More specifically, a difference value DN is compared with a predetermined value, and on the assumption that a time period when the absolute value of the difference value DN is larger than the predetermined value is the lock-in period, the factor L1 is used. On the other hand, on the assumption that a time period when the absolute value of the difference value DN is smaller than the predetermined value indicates the elapse of the lock-in period, the factor L2 is used.

Thus, a loop gain of the clock multiplication circuit 21 becomes greater during the lock-in period, and response characteristics are rendered higher, so that the frequency of the output clock signal ST approaches the predetermined value sooner. Accordingly, it is possible to shorten the lock-in period, that is, lockup time. On the other hand, since the loop gain is checked after the elapse of the lock-in period, response characteristics become lower, so that frequency lock getting out of tolerance due to a slight external disturbance, and so forth is prevented, thereby enabling stable control to be continued.

Figure 9:
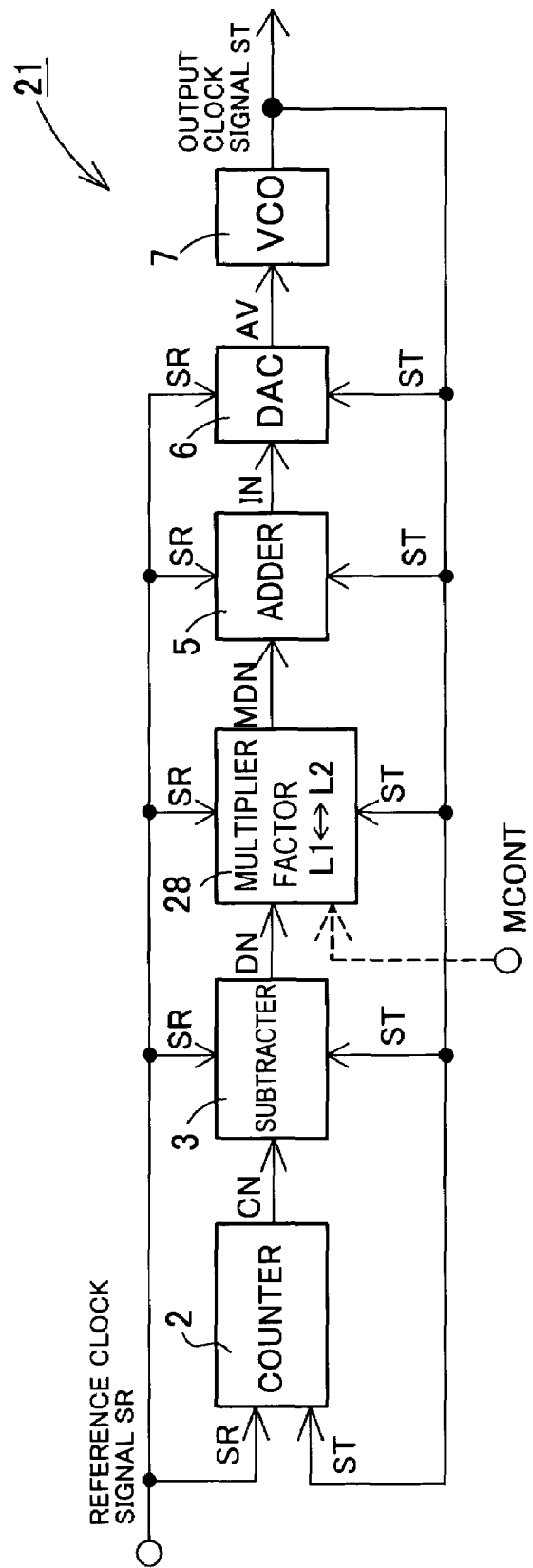
FIG. 9 is a block diagram showing the configuration of a clock multiplication circuit according to a variation 4.

As described above, the factor can be automatically changed by internally determination on circumstances with the multiplier 18, however, the factor for use by the multiplier 28 may be changed as appropriate by a direction of a factor control signal MCONT as indicated by a broken line in FIG. 9. By so doing, the factor can be changed at a appropriate time such as, for example, a completion time of the lock-in period, and so forth, by the direction of the factor control signal MCONT.

In any case, since the factor of the multiplier 28 is rendered variable, it is possible to use an appropriate factor at an appropriate time.

(Variation 5)

Figure 10:
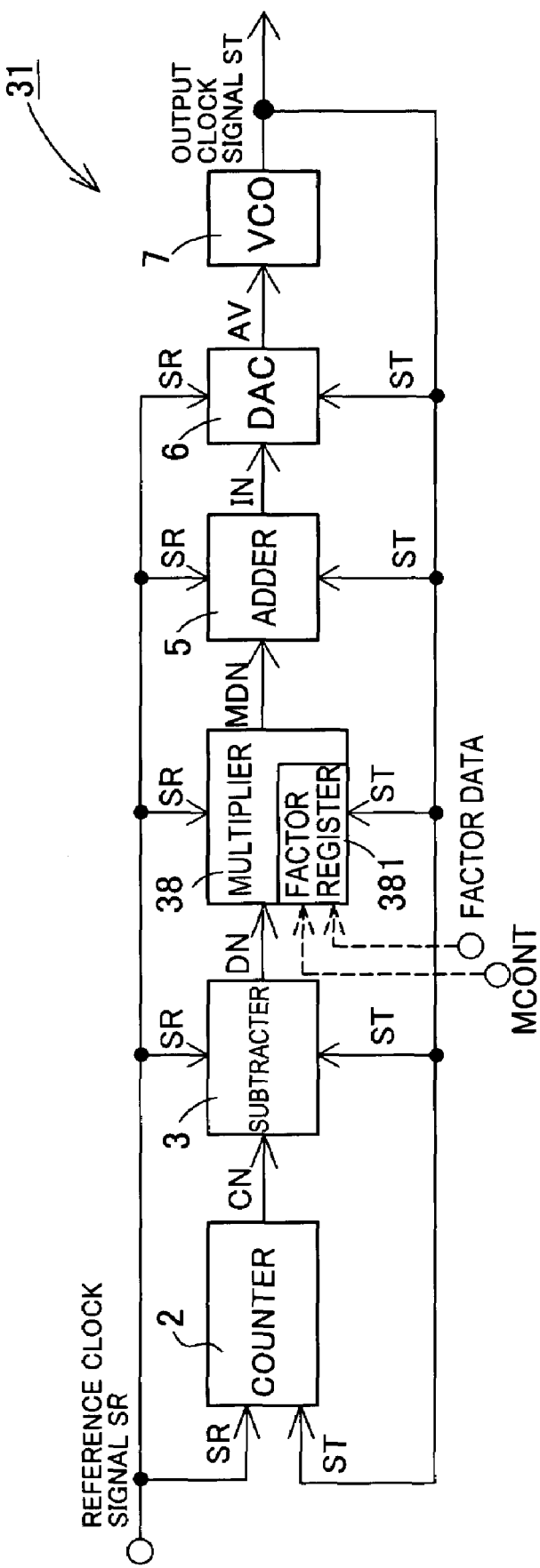
FIG. 10 is a block diagram showing the configuration of a clock multiplication circuit according to a variation 5.

With the variation 4, there is described a case of switching between the predetermined factors L1 and L2 of the multiplier 28 automatically or by the direction from the outside. However, as shown in a clock multiplication circuit 31 according to a variation 5 (refer to FIG. 10), the value of a factor L of a multiplier 38 may be rendered changeable from a direction from the outside. That is, the clock multiplication circuit 31 according to the variation 5 has a circuit configuration similar to that for the clock multiplication circuit 11 according to the embodiment 2 and the clock multiplication circuit 21 according to the variation 4, but differs from those in that the factor of the multiplier 38 can be set from the outside.

The multiplier 38 makes use of the factor L stored in a factor register 381 to thereby multiply a difference value DN by the factor L, and calculates a multiplied difference value MDN. Factor data in response to a factor control signal MCONT that is a load signal is written in the factor register 381. As a result, the multiplier 38 can executes multiplication by making use of the factor L written in the factor register 381.

By so doing, an appropriate loop gain can be set depending on the application purpose and application conditions of the clock multiplication circuit 31.

Embodiment 3

An embodiment 3 of a clock multiplication circuit 41 according to the invention is described hereinafter with reference to FIGS. 11 and 12. The clock multiplication circuit 41 according to the embodiment 3 comprises a counter 2, a subtracter 43, an adder 5, a DAC 6, and a VCO 7 as with the clock multiplication circuit 1 according to the embodiment 1. With the clock multiplication circuit 1, however, the reference value BN for use in the subtracter 3 is a fixed value. The clock multiplication circuit 41 according to the embodiment 3 differs from the clock multiplication circuit 1 in that the subtracter 43 is capable of switching a reference value between BN1 and BN2 (BN1>BN2).

Figure 12:
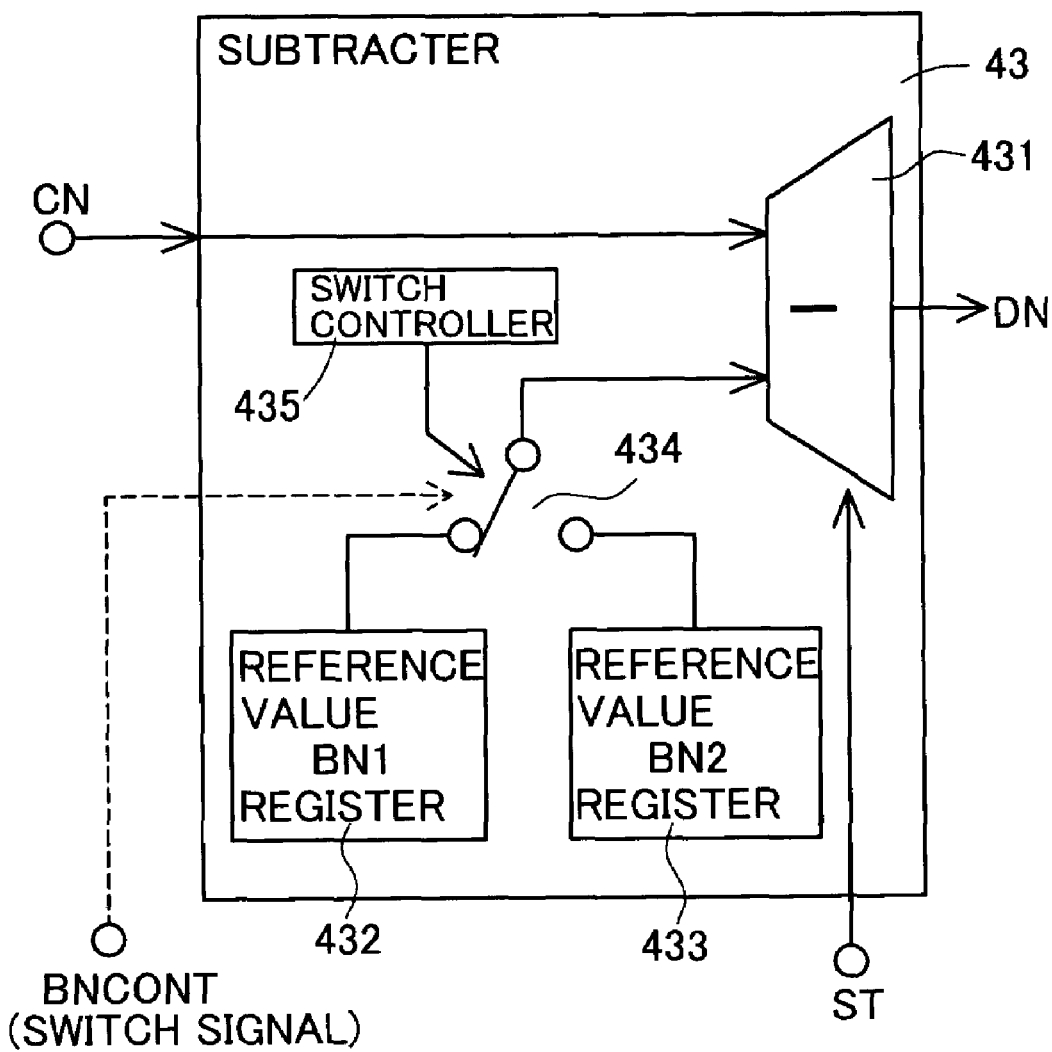
FIG. 12 is a schematic diagram showing the configuration of a subtracter of the clock multiplication circuit according to the embodiment 3.

As shown in FIG. 12, the subtracter 43 comprises two reference value registers 432, and 433, for storing the reference values BN1 and BN2, respectively, and a switch 434 selects use of either of the reference value registers 432, and 433. The subtracter 43 subtracts a count value CN from either of the two reference values BN1, BN2, thereby calculating a difference value DN. A switch controller 435 controls the switch 434, selecting either of the reference values BN1, BN2, stored in the reference value registers 432, and 433, respectively. Thus, either DN=BN1−CN or DN=BN2−CN is calculated as the difference value DN.

As previously described, since control is executed such that the count value CN becomes equal to the reference value BN, the reference value for use by the subtracter 43 is a value determining a multiple of the clock multiplication circuit 41. More specifically, the product of the reciprocal A of a duty ratio and the reference value BN, that is, A·BN, is equal to the multiple M of the clock multiplication circuit 41 (M=A·BN).

Depending on the application purpose of a clock multiplication circuit, there can be a case where it is desired to change over to an output clock signal ST at a different frequency by changing a multiple M relative to the frequency of a reference clock signal SR. In such a case, with the clock multiplication circuit 41 according to the embodiment 3, the reference value is changeable to either BN1 or BN2, so that the multiple M of the clock multiplication circuit 41 can be changed as appropriate by changing the reference value. More specifically, assuming that the duty ratio of a reference clock signal SR for use is, for example, 50%, it is possible to switch between a multiple M1=2·BN1 and a multiple M2=2·BN2.

Figure 11:
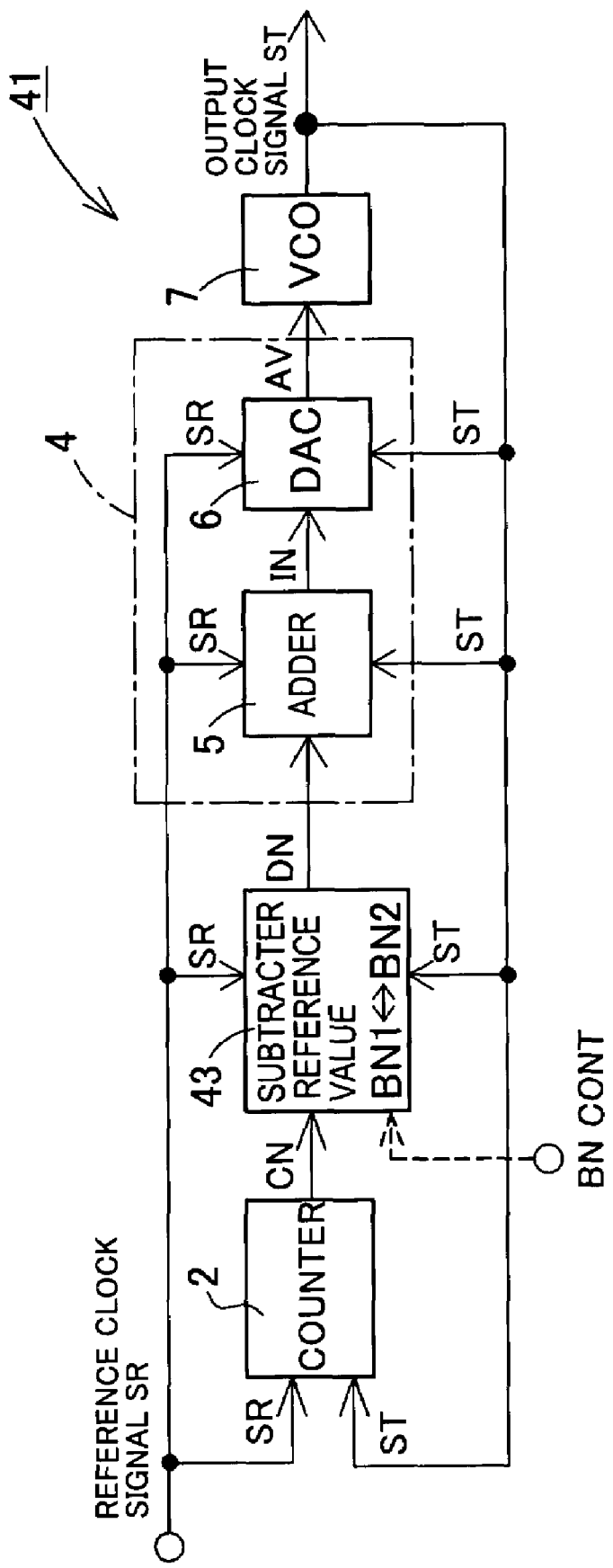
FIG. 11 is a block diagram showing the configuration of a clock multiplication circuit according to an embodiment 3.

Further, in changing the reference value, the reference value may be automatically changed over by the switch controller 435 built inside the subtracter 43 as described above, or by internal processing of the clock multiplication circuit 41, however, by changing over the switch 434 according to a direction of a reference value control signal BNCONT as shown by a broken line in FIGS. 11 and 12, respectively, the reference value for use by the subtracter 43 can be changed as appropriate. Then, by use of, for example, the reference value control signal BNCONT, the reference value, consequently, a multiple can be changed over at an appropriate timing. Furthermore, depending on the application purpose of the clock multiplication circuit 41, the reference value can be changed over beforehand for use besides changing over the same in the middle of operation.

In any case, since the reference value for use by the subtracter 43 is rendered variable, a multiple can be changed over as appropriate before use.

(Variation 6)

Figure 13:
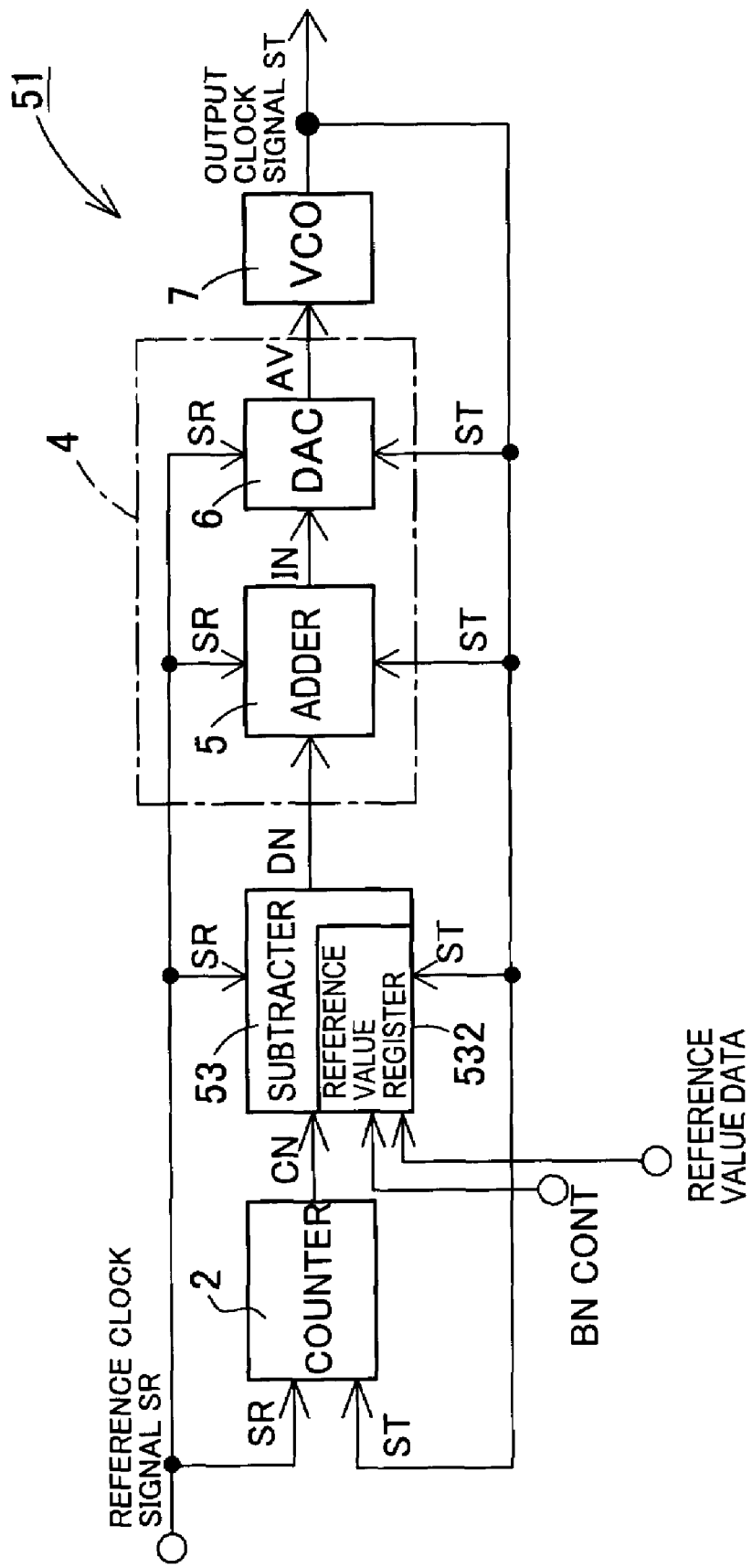
FIG. 13 is a block diagram showing the configuration of a clock multiplication circuit according to a variation 6.

With the embodiment 3, there is described a case where switching between the reference values BN1, BN2, pre-stored in the subtracter 43, is executed automatically or according to the direction from the outside. However, as shown in a clock multiplication circuit 51 according to a variation 6 (refer to FIG. 13), a reference value stored in a subtracter 53 may be rendered changeable from the outside. That is, the clock multiplication circuit 51 according to the variation 6 has a circuit configuration similar to that for the clock multiplication circuit 41 according to the embodiment 3, but differs from the latter in that the reference value for use in the subtracter 53 can be set from the outside.

Figure 14:
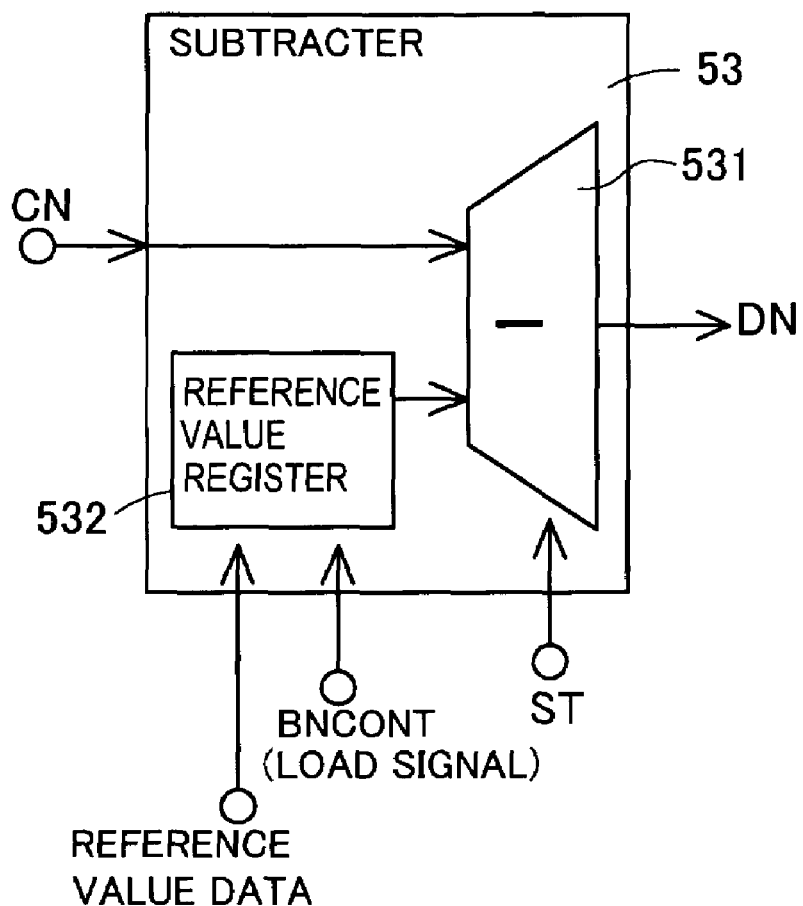
FIG. 14 is a schematic diagram showing the configuration of a subtracter of the clock multiplication circuit according to the variation 6.

The subtracter 53 (refer to FIG. 14) makes use of a reference value BN stored in a reference value register 532 and a sub-subtracter 531 subtracts a count value CN from the reference value BN, thereby calculating a difference value DN. Reference value data in response to a reference value control signal BNCONT that is a load signal is written in the reference value register 532. As a result, the subtracter 53 executes subtraction by making use of the reference value BN written in the reference value register 532.

By so doing, it is possible to set an appropriate multiple depending on the application purpose and application conditions of the clock multiplication circuit 51.

Embodiment 4

Figure 15:
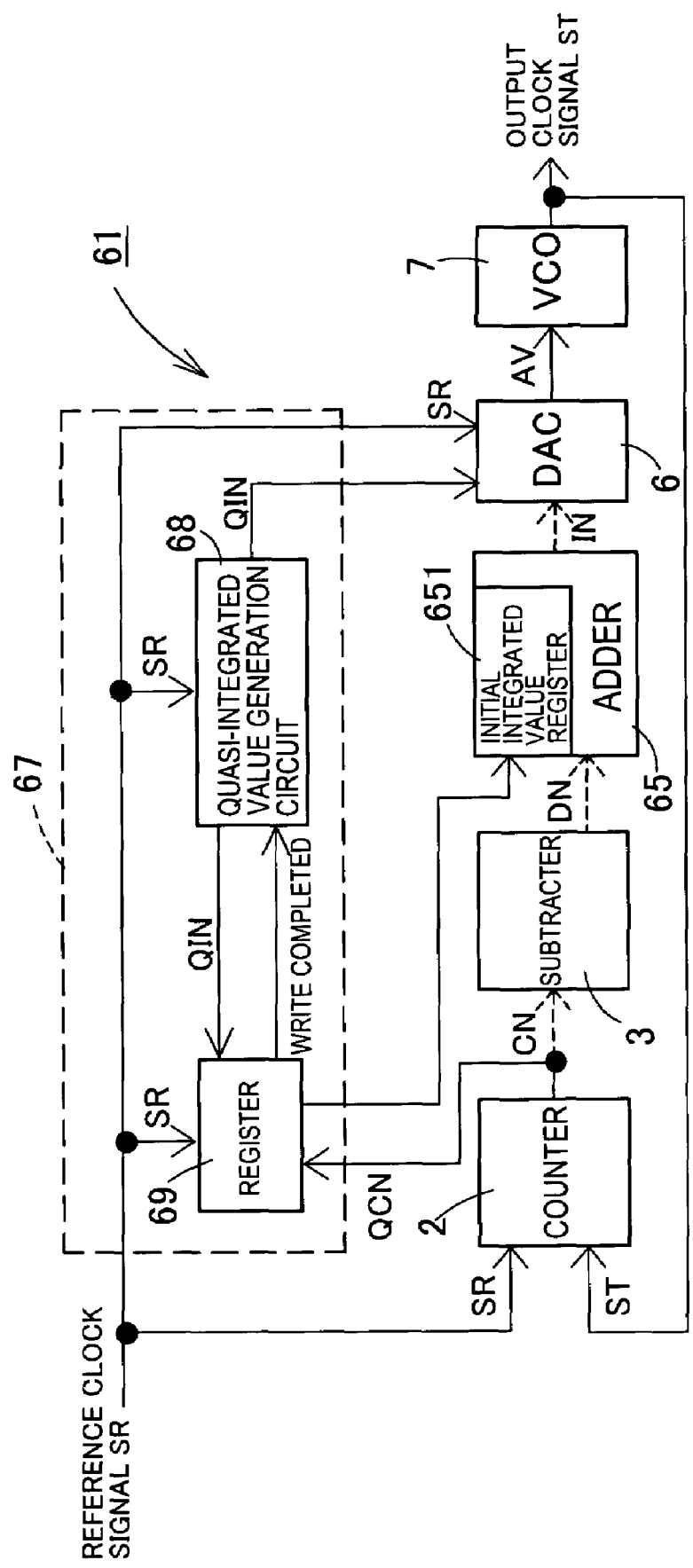
FIG. 15 is a block diagram showing the configuration of a clock multiplication circuit according to an embodiment 4.
Figure 16:
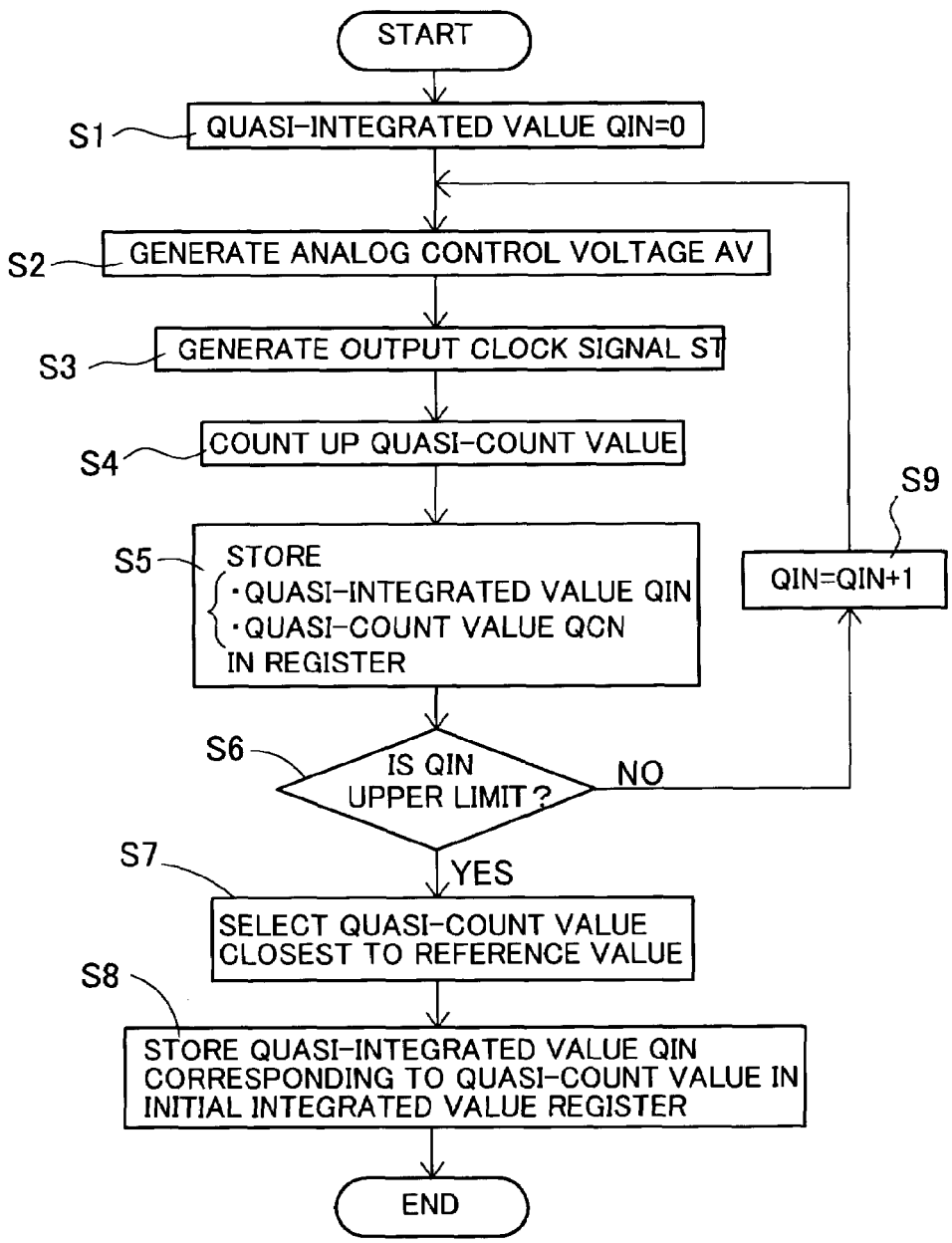
FIG. 16 is a flow chart of operation, showing the steps of obtaining an initial integrated value in the case of the clock multiplication circuit according to the embodiment 4.

An embodiment 4 of a clock multiplication circuit 61 according to the invention is described hereinafter with reference to FIGS. 15, 16, and 17. The clock multiplication circuit 61 according to the embodiment 4 comprises a counter 2, a subtracter 3, an adder 65, a DAC 6, and a VCO 7 as with the clock multiplication circuit 1 according to the embodiment 1 previously described. With the clock multiplication circuit 1, however, the initial value (the initial integrated value) INS of the integrated value IN calculated by the adder 5 is a fixed value provided at the outset. The clock multiplication circuit 61 according to the embodiment 4 differs from the clock multiplication circuit 1 in that an initial integrated value INS is obtained in the following manner by use of initial integrated value acquisition means 67.

In general, with the clock multiplication circuit 1, after the circuit is powered on or the contents of the counter 2, subtracter 3, and adder 5, respectively, are reset by agency of a reset signal, the initial integrated value INS is delivered from the adder 5. Hereupon, the analog control voltage AV of the DAC 6, corresponding to the initial integrated value INS, is delivered, and the VCO 7 delivers the output clock signal ST at a frequency dependent on the analog control voltage AV. Incidentally, if the initial integrated value INS is not a proper value, the frequency of the output clock signal ST delivered at the outset when the circuit is powered on becomes too high or too low. Although the frequency is controlled such that the count value CN finally becomes equal to the reference value. BN as previously described, longer time is required until the frequency of the output clock signal ST is stabilized if the initial integrated value INS is not a proper value as described. In other words, lockup time becomes longer.

Further, if the frequency of the output clock signal ST is extremely low due to the initial integrated value INS being an improper value, there can be a case where the frequency of the output clock signal ST delivered from the VCO 7 does not change before the start of a succeeding High level period (counting period) of the reference clock signal SR because the counter 2, the subtracter 3, and so forth operate in synchronization with the output clock signal ST. Then, there can occur a case where further longer time is required until the frequency is stabilized.

As with the clock multiplication circuit 1 (refer to FIG. 2) according to the embodiment 1 of the invention, the clock multiplication circuit 61 delivers the output clock signal ST having a frequency obtained by multiplying the frequency of the reference clock signal SR by a predetermined factor at times of normal use. The clock multiplication circuit 61 is configured such that the initial integrated value INS is autonomously acquired by the initial integrated value acquisition means 67 when the circuit is powered on for the first time. That is, as indicated by solid lines shown in FIG. 15, upon powering on the clock multiplication circuit 61 for the first time, a quasi-integrated value QIN (QIN=0) is inputted to the DAC 6 from a quasi-integrated value generation circuit 68 instead of from the adder 65 after oscillation at the VCO 7 (refer to Step S1 in FIG. 16). Hereupon, an analog control voltage AV corresponding to the quasi-integrated value QIN is delivered (Step S2). Then, an output clock signal ST at a frequency corresponding to the analog control voltage AV is delivered from the VCO 7 (Step S3). Hereupon, as with the embodiment 1, the number of the output clock signals ST existing during a High level period of the reference clock signal SR is counted by the counter 2, thereby obtaining a quasi-count value QCN (Step S4).

The quasi-count value QCN as obtained is a value corresponding to a frequency of the output clock signal ST, dependent on the quasi-integrated value QIN when the quasi-integrated value QIN is inputted to the DAC 6. Accordingly, both the values are stored in a register 69 (Step S5). More specifically, the quasi-integrated value QIN and the quasi-count value QCN are stored in the register 69 so as to be related with each other as shown in FIG. 17. In Step S6, whether or not the quasi-integrated value QIN is the upper limit value (for example, "11111111" in the case of 8 bits) is determined (Step S6). If it is not the upper limit value (No), a write completion signal is transmitted to the quasi-integrated value generation circuit 68. Hereupon, the quasi-integrated value generation circuit 68 generates a quasi-integrated value QIN as incremented, whereupon the operation is repeated from Step S2 to Step S6. Thus, the quasi-integrated value QIN and the quasi-count value QCN, sequentially varied, are stored in the register 69 so as to correspond to each other. When the quasi-integrated value QIN sequentially increases, and finally reaches the upper limit value in Step S6 (Yes), the register 69 is browsed, and a quasi-count value QCN equal to, or closest to a reference value BN is selected (Step S7). Subsequently, a quasi-integrated value corresponding to the quasi-count value QCN as selected is stored in an initial integrated value register 651 of the adder 65 as an initial integrated value INS (Step S8).

Thus, since the quasi-integrated value QIN from which the quasi-count value QCN equal to, or closest to the reference value BN can be obtained is stored as the initial integrated value INS, it is possible to deliver an output clock signal ST at a frequency close to an appropriate frequency by use of the initial integrated value INS immediately after the circuit 61 is powered on or immediately after the circuit 61 is reset. Accordingly, lockup time can be rendered extremely short.

With the embodiment 4, the clock multiplication circuit 61 is configured such that the initial integrated value INS is autonomously acquired by the initial integrated value acquisition means 67 when the circuit 61 is powered on for the first time. However, it is also possible to set such that the initial integrated value INS is first acquired by the initial integrated value acquisition means 67 at any time when power supply to the clock multiplication circuit 61 is started. Further, it is also possible to set such that the initial integrated value acquisition means 67 can be activated at an appropriate time according to a direction from the outside.

Further, with the embodiment 4, the quasi-integrated value generation circuit 68 generates the quasi-integrated value QIN as incremented, but may generate a quasi-integrated value QIN as decremented.

(Variation 7)

With the clock multiplication circuit 61 according to the embodiment 4, the quasi-integrated value QIN is caused to undergo sequential changes by use of the quasi-integrated value generation circuit 68 and the register 69, the quasi-integrated value QIN and the quasi-count value QCN are stored so as to be related with each other, the quasi-count value QCN equal to, or closest to the reference value BN is selected, and subsequently, a quasi-integrated value corresponding to the quasi-count value QCN as selected is stored in an initial integrated value register 651 as the initial integrated value INS.

Figure 18:
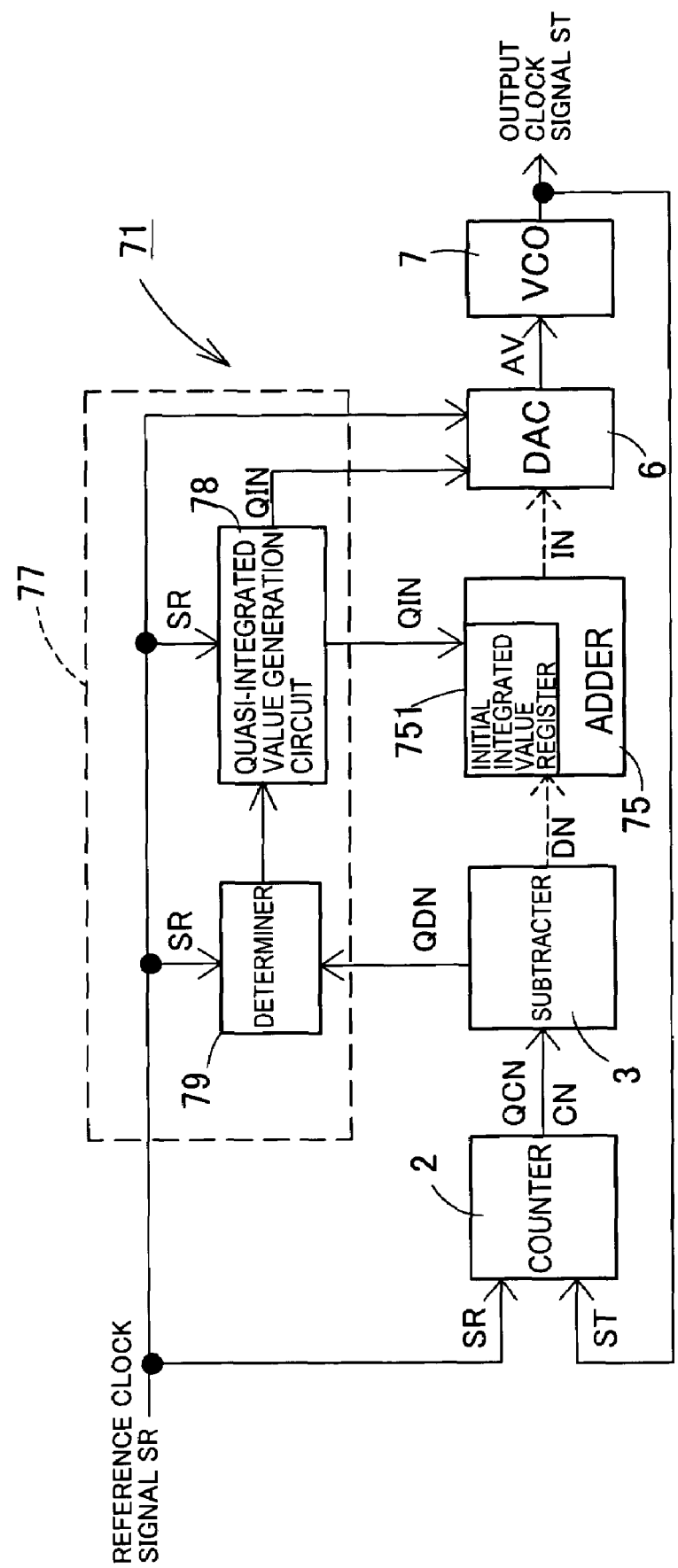
FIG. 18 is a block diagram showing the configuration of a clock multiplication circuit according to a variation 7.

In contrast, a clock multiplication circuit 71 according to a variation 7 differs from the clock multiplication circuit 61 in that an initial integrated value INS is acquired by use of initial integrated value acquisition means 77 comprising a quasi-integrated value generation circuit 78 and a determiner 79 as shown in FIG. 18.

Figure 19:
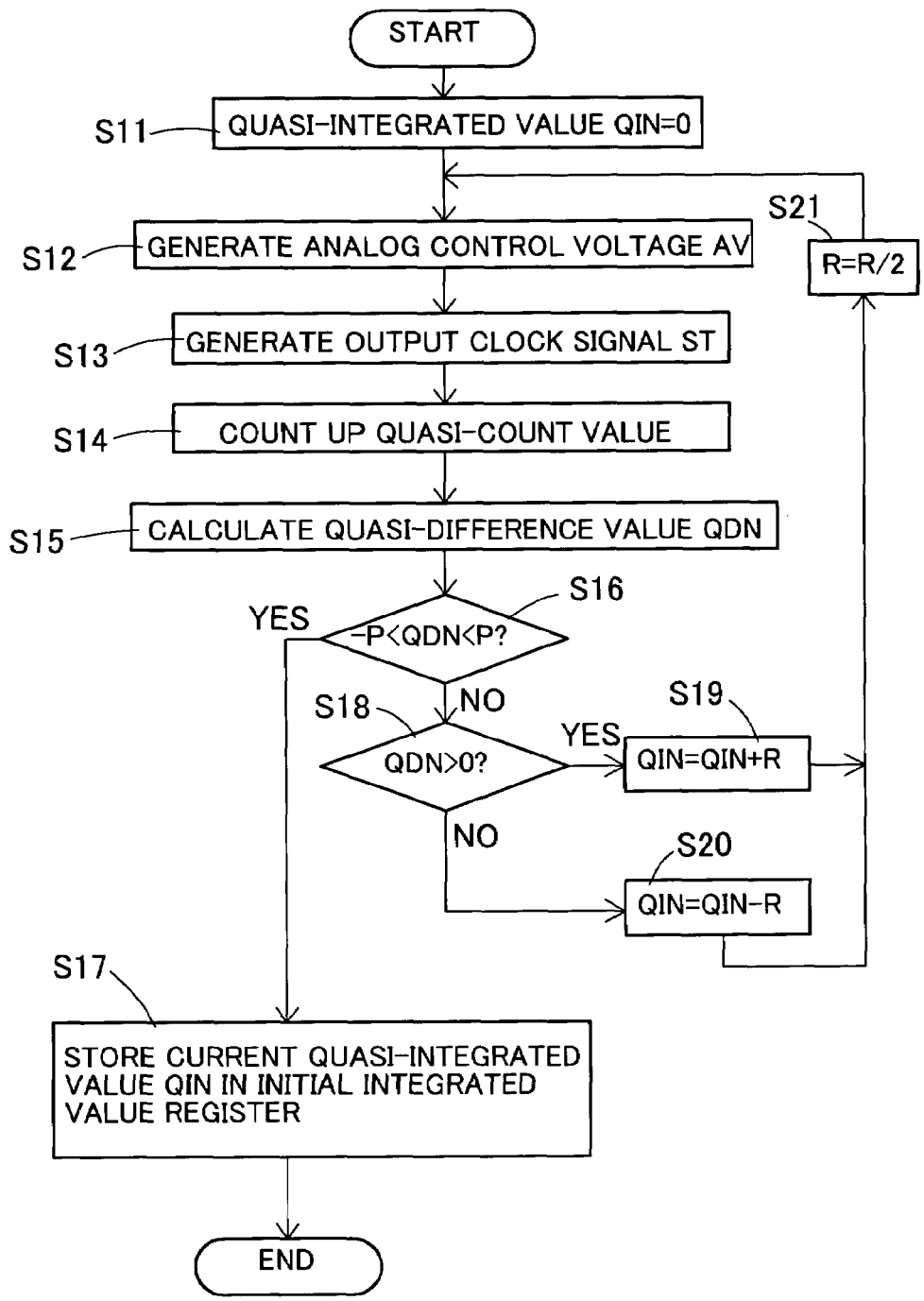
FIG. 19 is a flow chart of operation, showing the steps of obtaining an initial integrated value in the case of the clock multiplication circuit according to the variation 7.

That is, as with the clock multiplication circuit 1 (refer to FIG. 2) according to the embodiment 1, the clock multiplication circuit 71 according to the variation 7 as well delivers an output clock signal ST having a frequency obtained by multiplying the frequency of a reference clock signal SR by a predetermined factor at times of normal use. Now, the clock multiplication circuit 71 is configured such that the initial integrated value INS is first autonomously acquired by use of the initial integrated value acquisition means 77 upon start of power supply to the circuit 71. More specifically, as indicated by solid lines in FIG. 18, upon supply of power to the clock multiplication circuit 71, a quasi-integrated value QIN (QIN=0) is inputted to a DAC 6 from the quasi-integrated value generation circuit 78 instead of from an adder 75 after oscillation by a VCO 7 (refer to Step S11 in FIG. 19). Hereupon, an analog control voltage AV corresponding to the quasi-integrated value QIN is delivered (Step S12). Then, an output clock signal ST at a frequency corresponding to the analog control voltage AV is delivered from the VCO 7 (Step S13). Hereupon, as with the embodiment 4, the number of the output clock signals ST existing during a High level period of the reference clock signal SR is counted by the counter 2, thereby obtaining a quasi-count value QCN (Step S14). Further, by subtracting the quasi-count value QCN from a reference value BN, a quasi-difference value QDN is obtained (Step S15).

The determiner 79 determines whether or not the quasi-difference value QDN is within a predetermined range, more specifically, whether or not –P<QDN<P (Step S16). Herein, if "No", that is, QDN–P or QDN≦P, the determiner 79 further determines whether or not QDN>0 (Step S18). Hereupon, if "Yes", that is, QDN is a positive value, this indicates that the quasi-count value QCN is a value smaller than the reference value BN, and hence, the frequency of an output clock signal ST being generated at present is low. Accordingly, the operation proceeds to Step S19, thereby determining a value obtained by adding a variation R to the present quasi-integrated value QIN as a new quasi-integrated value QIN. On the other hand, if "No", that is, QDN is a negative value, this indicates that the quasi-count value QCN is a value larger than the reference value BN, and hence, the frequency of an output clock signal ST being generated at present is high. Hereupon, the operation proceeds to Step S20, thereby determining a value obtained by subtracting the variation R from the present quasi-integrated value QIN as a new quasi-integrated value QIN. Subsequently, after setting a next variation to half of the present variation R (new R=½R) in Step S21, the operation reverts to Step S12. The quasi-integrated value QIN is increased or decreased in this way by the quasi-integrated value generation circuit 78 and the determiner 79 and thereby the operation is repeated until "Yes", that is, "–P<QDN<P" is determined in Step S16. Upon finally determining on "–P<QDN<P", the operation proceeds to Step S17, and the present quasi-integrated value QIN is stored in an initial integrated value register 751 of the adder 75 as an initial integrated value INS.

Thus, the quasi-integrated value QIN at the time when the quasi-difference value QDN falls within the predetermined range (–P<QDN<P) can be stored in the initial integrated value register 751 as the initial integrated value INS. Accordingly, it is possible to deliver an output clock signal ST at a frequency close to an appropriate frequency by use of the initial integrated value INS immediately after the circuit 71 is powered on or immediately after the circuit 71 is reset. As a result, lockup time can be rendered extremely short.

With the clock multiplication circuit 71 according to the variation 7, there is no need for preparing such a memory with a large capacity as the register 69 of the clock multiplication circuit 61 according to the embodiment 4. Further, as soon as the initial integrated value INS is obtained, an acquisition operation of the initial integrated value INS can be completed, so that the initial integrated value INS can be acquired in short time.

With the variation 7, the clock multiplication circuit 71 is configured such that the initial integrated value INS is first autonomously acquired by the initial integrated value acquisition means 77 at any time when the clock multiplication circuit 71 is powered on. However, it is also possible to set such that the initial integrated value INS is acquired by the initial integrated value acquisition means 77 only when the clock multiplication circuit 71 is powered on for the first time. Further, it is also possible to set such that the initial integrated value acquisition means 77 can be activated at an appropriate time according to a direction from the outside.

(Variation 8)

With the clock multiplication circuit 61, 71 according to the embodiment 4 and the variation 7, respectively, the initial integrated value INS is acquired by the initial integrated value acquisition means 67, 77, respectively, after the start of powering on the respective circuits, and so on, aside from the generation of an output clock signal ST as normally done.

Figure 20:
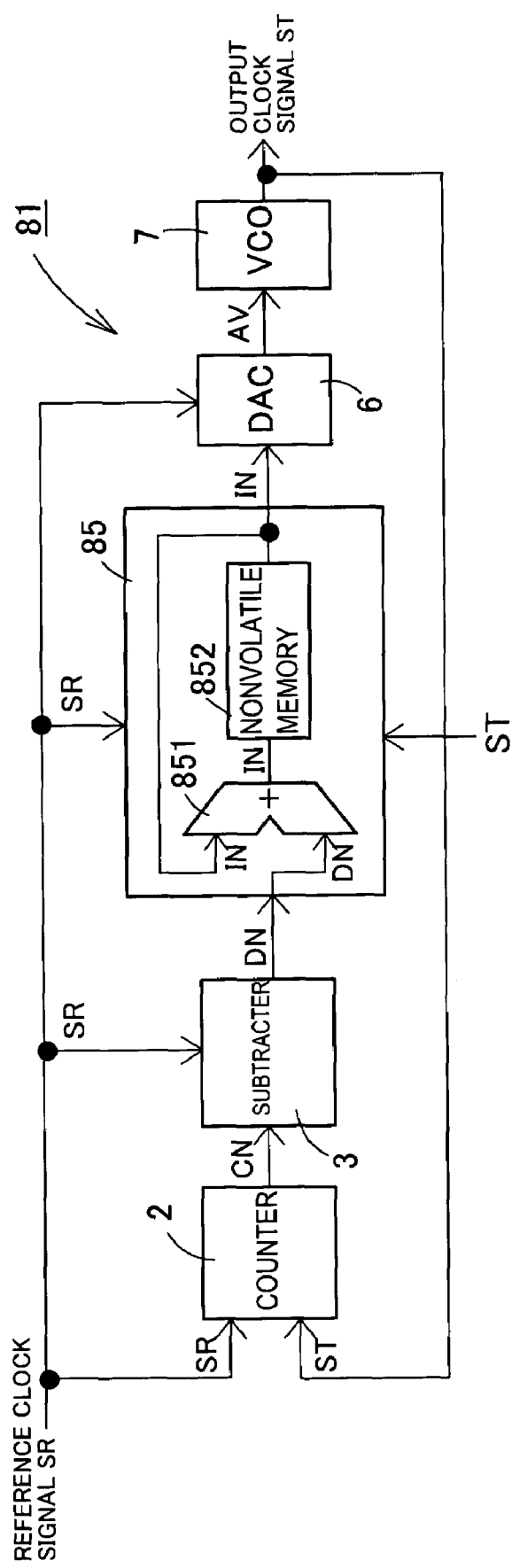
FIG. 20 is a block diagram showing the configuration of a clock multiplication circuit according to a variation 8.

In contrast, a clock multiplication circuit 81 according to a variation 8 differs from those in that an integrated value IN used at the time of a preceding operation of the clock multiplication circuit 81 is stored by use of an adder 85 incorporating a sub-adder 851 and a nonvolatile memory 852 as shown in FIG. 20, and the integrated value IN is taken as an initial integrated value INS. With the variation 8, the nonvolatile memory 852 serves as initial integrated value acquisition means.

The clock multiplication circuit 81 according to the variation 8 comprises a counter 2, a subtracter 3, the adder 85, a DAC 6, and a VCO 7, similarly to the clock multiplication circuit 1 according to the embodiment 1 previously described (refer to FIG. 2). However, the clock multiplication circuit 81 differs from the clock multiplication circuit 1 in that the adder 85 of the circuit 81 is provided with the sub-adder 851 for summing up a difference value DN and the integrated value IN used at the time of the preceding operation of the clock multiplication circuit 81, and additionally, the nonvolatile memory 852 for storing the result of such summing up.

As described above, the clock multiplication circuit 81 has the nonvolatile memory 852, which sequentially overwrites a new integrated value IN every time the same is obtained and stores the same therein. Accordingly, if the clock multiplication circuit 81 is powered off or is reset, an integrated value IN calculated at the last time is continuously stored. Upon the resumption of power supply to the clock multiplication circuit 81, the adder 85 delivers first an integrated value IN that has been stored in the nonvolatile memory 852. That is, the integrated value IN stored is used as an initial integrated value INS. Upon resetting the circuit 81, the same applies since an integrated value IN obtained immediately before the resetting is kept stored.

Incidentally, when the clock multiplication circuit 81 is in operation, an output clock signal ST having a frequency that is a multiple of the frequency of a reference clock signal SR is normally being delivered except for a lock-in period. In this case, the integrated value IN being delivered from the adder 85 should have been a value controlled such that a difference value DN is at 0. Hence, if power is turned off in such a state, an integrated value IN corresponding to the difference value DN at 0 should be stored in the nonvolatile memory 852. Accordingly, since the integrated value IN can be used as the initial integrated value INS, it is possible to deliver an output clock signal ST at a frequency close to an appropriate frequency immediately after the circuit 81 is powered on or is reset. As a result, lockup time can be rendered extremely short.

Further, since the initial integrated value INS is pre-obtained at the time of a preceding operation, there is no need for a special operation to obtain the initial integrated value INS, so that an optimum initial integrated value can be acquired with ease. Furthermore, even in case that the characteristics of VCO, and so forth, undergo change over time, it will always be possible to use an optimum initial integrated value. In addition, since only one nonvolatile memory will suffice, the circuit 81 is simple in configuration.

(Variation 9)

Figure 21:
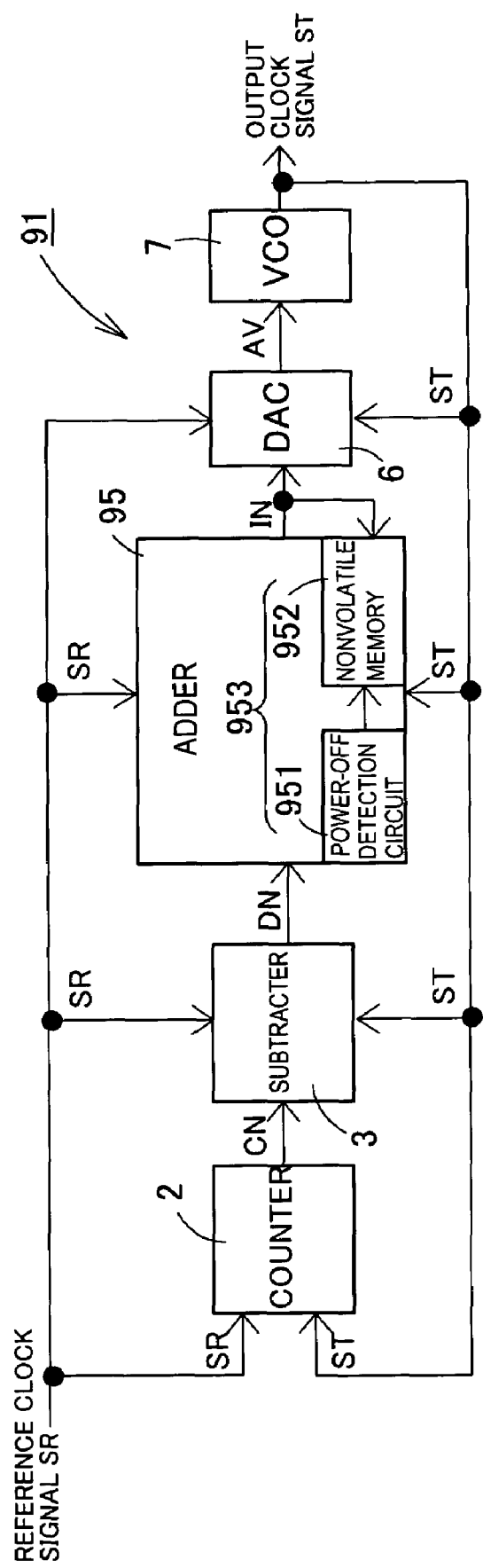
FIG. 21 is a block diagram showing the configuration of a clock multiplication circuit according to a variation 9.

With the clock multiplication circuit 81 according to the variation 8, the initial integrated value INS is obtained by sequentially overwriting, and storing the integrated value IN as calculated in the nonvolatile memory (initial integrated value acquisition means) 852. In contrast, a clock multiplication circuit 91 according to a variation 9 differs from the clock multiplication circuit 81 in that use is made of an adder 95 comprising initial integrated value acquisition means 953 incorporating a nonvolatile memory 952, and a power-off detection circuit 951 for detecting power-off, as shown in FIG. 21.

That is, the clock multiplication circuit 91 according to the variation 9 comprises a counter 2, a subtracter 3, the adder 95, a DAC 6, and a VCO 7, similarly to the clock multiplication circuit 1 according to the embodiment 1 previously described (refer to FIG. 2). The adder 95 of the circuit 91 is an adder for summing up a difference value DN and the integrated value IN at the time of a preceding operation to thereby calculate a new integrated value IN. However, if the power-off detection circuit 951 detects power-off of the circuit upon occurrence of a drop in power source voltage, and so forth, an integrated value IN being delivered at present is stored in the nonvolatile memory 952 by a direction of the power-off detection circuit 951.

Further, the power-off detection circuit 951 may be provided with an auxiliary power source such as a capacitor etc. so as to maintain the power potential of the nonvolatile memory 952 until the present integrated value IN is stored in the nonvolatile memory 952 in order to present the nonvolatile memory 952 from becoming unstable in operation or inoperable as a result of a drop in the power source potential due to the power-off of the circuit 91.

Thus, with the clock multiplication circuit 91, the integrated value IN remains stored in the nonvolatile memory 952 even after the power-off. As described with reference to the variation 8, the integrated value IN being normally delivered from the adder 95 should have been a value controlled such that a difference value DN is at 0 except for a lock-in period. Then, if power is turned off in such a state, the integrated value IN corresponding to a difference value DN at 0 should be stored in the nonvolatile memory 952.

Accordingly, since the integrated value IN can be used as an initial integrated value INS, it is possible to deliver an output clock signal ST at a frequency close to an appropriate frequency immediately after the circuit 91 is powered on again. Hence, lockup time can be rendered extremely short.

Further, even after the circuit 91 is reset, the integrated value IN stored in the nonvolatile memory 952 can be used as the initial integrated value INS.

Further, since the initial integrated value INS is pre-obtained at the time of a preceding operation, an optimum initial integrated value can be acquired with ease. Furthermore, even in case that the characteristics of VCO and so forth undergo change over time, it will always be possible to use an optimum initial integrated value. In addition, the circuit 91 is simple in configuration.

(Variation 10)

With the clock multiplication circuit 91 according to the variation 9, use is made of the power-off detection circuit 951 and the nonvolatile memory 952, and when the power-off of the circuit 91 is detected, the present integrated value IN is stored in the nonvolatile memory 952 so as to be taken as the initial integrated value INS.

Figure 22:
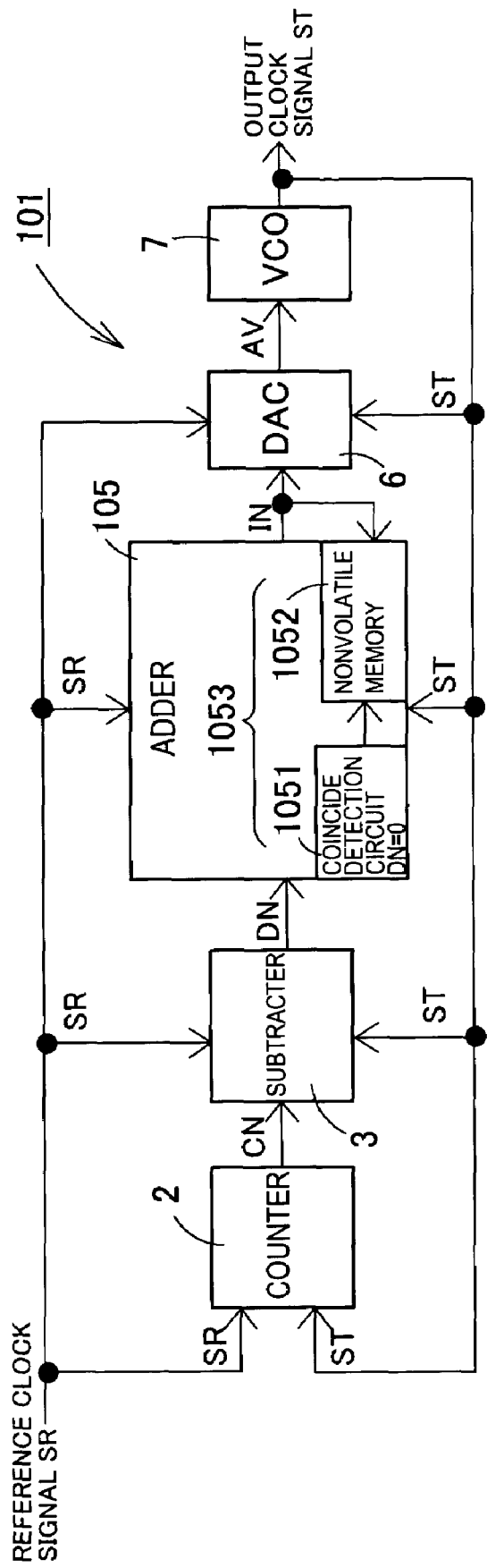
FIG. 22 is a block diagram showing the configuration of a clock multiplication circuit according to a variation 10.

In contrast, a clock multiplication circuit 101 according to a variation 9 differs from the clock multiplication circuit 91 in that use is made of an adder 105 comprising initial integrated value acquisition means 1053 incorporating a nonvolatile memory 1052, and a coincidence detection circuit 1051 for determining whether or not a difference value DN=0, as shown in FIG. 22.

That is, the clock multiplication circuit 101 according to the variation 10 as well comprises a counter 2, a subtracter 3, the adder 105, a DAC 6, and a VCO7, similarly to the clock multiplication circuit 1 according to the embodiment 1 previously described (refer to FIG. 2). The adder 105 of the circuit 101 is an adder for summing up a difference value DN and the integrated value IN at the time of a preceding operation to thereby calculate a new integrated value IN as with the case of the adder 5 of the first embodiment. However, with the adder 105, the coincidence detection circuit 1051 detects whether or not a difference value DN as calculated by the subtracter 3 is zero (DN=0), aside from calculating an integrated value IN, and if DN=0, an integrated value IN being delivered at present is overwritten, and stored in the nonvolatile memory 1052 by a direction of the coincidence detection circuit 1051.

Thus, with the clock multiplication circuit 101, once DN=0, the integrated value IN remains stored in the nonvolatile memory 1052 even after the circuit 101 is powered off. The same applies after the circuit 101 is reset. As previously described, the integrated value IN being normally delivered from the adder 105 should have been a value controlled such that a difference value DN is at 0 except for a lock-in period. Since the integrated value IN at the time when DN=0 has been stored, it follows that the integrated value IN, corresponding to the difference value DN at 0, remains stored in the nonvolatile memory 1052 even if the circuit 101 is thereafter powered off or reset.

Accordingly, since the integrated value IN can be used as an initial integrated value INS, it is possible to deliver an output clock signal ST at a frequency close to an appropriate frequency immediately after the circuit 101 is powered on again or is reset. As a result, lockup time can be rendered extremely short.

Further, since the initial integrated value INS is pre-obtained at the time of a preceding operation, an optimum initial integrated value can be acquired with ease. Furthermore, even in case that the characteristics of VCO, and so forth undergo change over time, it will always be possible to use an optimum initial integrated value. In addition, the circuit 101 is simple in configuration.

Embodiment 5

Figure 23:
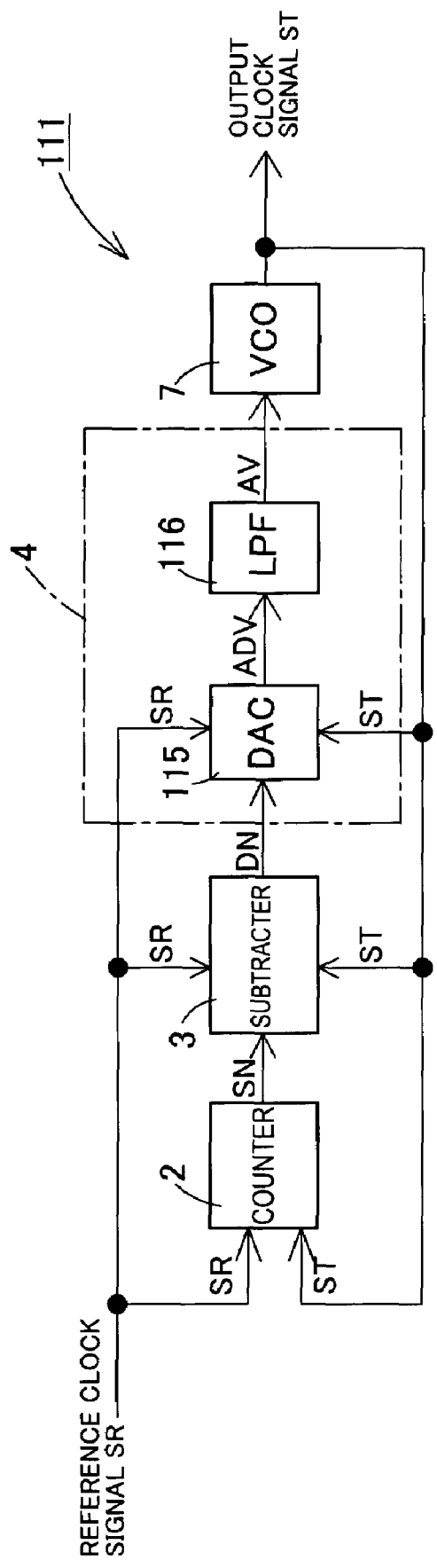
FIG. 23 is a block diagram showing the configuration of a clock multiplication circuit according to an embodiment 5.

Further, an embodiment 5 of the invention is described hereinafter with reference to FIG. 23. Any of the embodiments 1 to 4 and the variations 1 to 10 is provided with the analog control voltage generation circuit 4 comprising the adder 5 for calculating the integrated value IN from the difference value DN (or the multiplied difference value MDN), and so forth, and the DAC 6 for converting the integrated value IN into the analog control voltage AV, so that the frequency of the output clock signal ST delivered from the VCO 7 is controlled with the analog control voltage AV.

In contrast, a clock multiplication circuit 111 according to the embodiment 5 differs from those clock multiplication circuits described above in that an analog control voltage generation circuit 4 comprises a DAC 115 and an analog circuit LPF 116.

That is, with the clock multiplication circuit 111, the DAC 115 first converts a difference value DN into an analog difference voltage ADV that is an analog voltage, and thereafter, the LPF 116 integrates the analog difference voltage ADV to thereby deliver an analog control voltage AV to a VCO 7.

In other words, with the embodiment 1 etc., the numerical data (digital value) is first integrated by the adder 5 etc., and thereafter, the integrated value is converted into the analog control voltage AV by the DAC 6, however, with the clock multiplication circuit 111 according to the embodiment 5, the difference value DN is first converted into the analog difference voltage ADV by the DAC 115, and integration is executed thereafter.

Even in this way, the analog control voltage AV can be obtained and delivered to the VCO 7.

In the foregoing, the embodiments 1 to 5 and the variations 1 to 10 have been described, however, it is to be understood that the scope of the invention is not limited thereto, and obviously changes and variations as appropriate may be made without departing from the spirit or scope of the invention.

Figure 6:
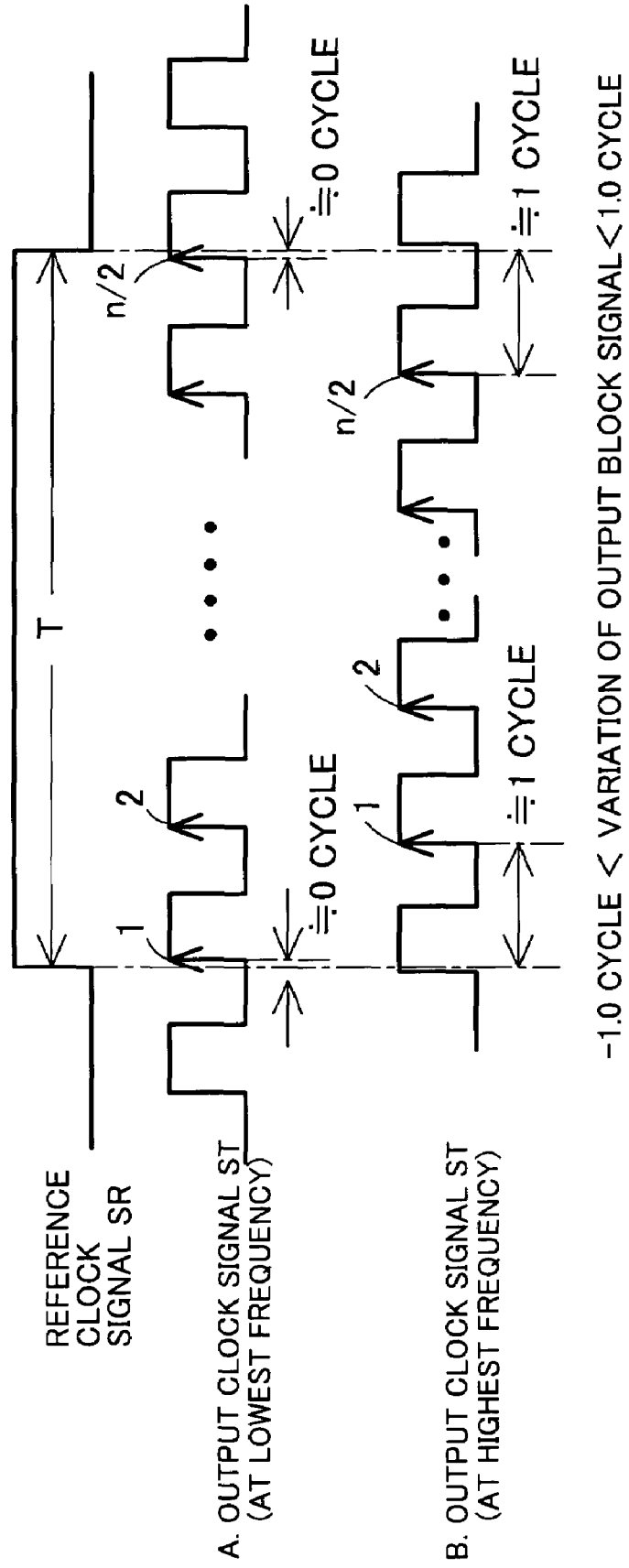
FIG. 6 is a schematic diagram illustrating fluctuation of an output clock signal at the time of counting rising edges of the output clock signal for control.

For example, with the embodiment 1, and so forth, the count value CN has been obtained with the use of the rising edges of the output clock signal ST (refer to FIG. 6). With the variation 3, the count value CN has been obtained with the use of both the rising edges and the falling edges of the output clock signal ST (refer to FIG. 7). In contrast with the cases of the embodiment 1, and so forth, it is also possible to obtain the count value CN with the use of the falling edges of the output clock signal ST.

Further, with the embodiment 2 (refer to FIG. 8) and the variations 4, 5 (refer to FIGS. 9 and 10), the multipliers 18, 28, 38 have been interposed between the subtracter 3 and the adder 5, respectively, and the adder 5 has calculated the integrated value IN with the use of the multiplied difference value MDN. With the other embodiments etc. as well, a multiplier can be interposed between the subtracter and the adder. Still further, with the embodiment 5 (refer to FIG. 23) as well, a multiplier may be interposed between the subtracter 3 and the DAC 115, that is, between the subtracter 3 and the analog control voltage generation circuit 4, thereby causing the DAC 115 to generate the analog control voltage AV with the use of a multiplied difference value MDN.

What is claimed is:

1. A clock multiplication circuit for delivering an output clock signal at a frequency that is a multiple of the frequency of a reference clock signal as inputted, the clock multiplication circuit comprising:

a counter for delivering a total count value by counting the total number of effective transition edges of the output clock signal, existing during a predetermined counting period given on the basis of the reference clock signal;

a subtracter for delivering a difference value obtained by subtracting either the total count value or a reference value from the other;

a control voltage generation circuit for delivering an analog control voltage corresponding to an integrated value of the difference value obtained by adding a new difference value to the stored integrated value; and a voltage control oscillator circuit for delivering the output clock signal at a frequency corresponding to the analog control voltage, wherein the counter is a counter for delivering the total count value by counting the total number of the effective transition edges of the output clock signal, existing during the counting period when the reference clock signal is only at a High level, and the counter, the subtracter, the control voltage generation circuit, and the voltage control oscillator circuit having response characteristics such that when the total count value is changed from a preceding total count value, the frequency of the output clock signal is changed during a period in which the reference clock signal is a Low level, after the end of the counting period and before the start of a succeeding counting period.

2. A clock multiplication circuit for delivering an output clock signal at a frequency that is a multiple of the frequency of a reference clock signal as inputted, the clock multiplication circuit comprising:

a counter for delivering a total count value by counting the total number of effective transition edges of the output clock signal, existing during a predetermined counting period given on the basis of the reference clock signal;

a subtracter for delivering a difference value obtained by subtracting either the total count value or a reference value from the other;

a control voltage generation circuit for delivering an analog control voltage corresponding to an integrated value of the difference value obtained by adding a new difference value to the stored integrated value; and a voltage control oscillator circuit for delivering the output clock signal at a frequency corresponding to the analog control voltage, wherein the counter is a counter for obtaining the total count value at the end of each High level period and each Low level period of the reference clock signal, and the counter, the subtracter, the control voltage generation circuit and the voltage control oscillator circuit having response characteristics in which when the total count value obtained by counting during a High level period of the reference clock signal is changed from a preceding total count value, the frequency of the output clock signal is changed after the end of the High level period of the reference clock signal and before the start of the next High level period of the reference clock signal and the characteristics in which when the total count value obtained by counting during a Low level period of the reference clock signal is changed from a preceding total count value, the frequency of the output clock signal is changed after the end of the Low level period of the reference signal and before the start of the next Low level period of the reference signal.

3. A clock multiplication circuit for delivering an output clock signal at a frequency that is a multiple of the frequency of a reference clock signal as inputted, the clock multiplication circuit comprising:

a counter for delivering a total count value by counting the total number of effective transition edges of the output clock signal, existing during a predetermined counting period given on the basis of the reference clock signal;

a subtracter for delivering a difference value obtained by subtracting either the total count value or a reference value from the other;

a control voltage generation circuit for delivering an analog control voltage corresponding to an integrated value of the difference value obtained by adding a new difference value to the stored integrated value; and a voltage control oscillator circuit for delivering the output clock signal at a frequency corresponding to the analog control voltage, wherein the counter delivers the total count value after the end of the counting period and in synchronization with the output clock signal, the subtracter generates a difference value in sync with an output clock signal generated after the counter generates a total count value in sync with an output clock signal, the control voltage generation circuit generates an analog control signal in sync with an output clock signal generated after the subtracter generates the difference value in sync with the output clock signal.

4. A clock multiplication circuit for delivering an output clock signal at a frequency that is a multiple of the frequency of a reference clock signal as inputted, the clock multiplication circuit comprising:

a counter for delivering a total count value by counting the total number of effective transition edges of the output clock signal, existing during a predetermined counting period given on the basis of the reference clock signal;

a subtracter for delivering a difference value obtained by subtracting either the total count value or a reference value from the other;

a control voltage generation circuit for delivering an analog control voltage corresponding to an integrated value of the difference value; and a voltage control oscillator circuit for delivering the output clock signal at a frequency corresponding to the analog control voltage, wherein the counter counts each rising edge at which the output clock signal transmits from a Low level to a High level and each falling edge at which the output clock signal transmits from the High level to the Low level as the effective transition edges of the output clock signal.

5. A clock multiplication circuit for delivering an output clock signal at a frequency that is a multiple of the frequency of a reference clock signal as inputted, the clock multiplication circuit comprising:

a counter for delivering a total count value by counting the total number of effective transition edges of the output clock signal, existing during a predetermined counting period given on the basis of the reference clock signal;

a subtracter for delivering a difference value obtained by subtracting either the total count value or a reference value from the other;

a control voltage generation circuit for delivering an analog control voltage corresponding to an integrated value of the difference value; and a voltage control oscillator circuit for delivering the output clock signal at a frequency corresponding to the analog control voltage, wherein a multiplier for multiplying the difference value by a predetermined factor and delivering a multiplied difference value to the control voltage generation circuit is interposed between the subtracter and the control voltage generation circuit.

6. A clock multiplication circuit according to claim 5, wherein the multiplier comprised of a shift register for implementing bit shift of the difference value by predetermined bits.

7. A clock multiplication circuit according to claim 5, wherein a factor of the multiplier is variable.

8. A clock multiplication circuit according to claim 7, further comprising factor control means for controlling the factor of the multiplier, the factor control means being capable of raising the factor to a relatively high number during a lock-in period, and lowering the factor to a relatively low number after the end of the lock-in period.

9. A clock multiplication circuit for delivering an output clock signal at a frequency that is a multiple of the frequency of a reference clock signal as inputted, the clock multiplication circuit comprising:

a counter for delivering a total count value by counting the total number of effective transition edges of the output clock signal, existing during a predetermined counting period given on the basis of the reference clock signal;

a subtracter for delivering a difference value obtained by subtracting either the total count value or a subtracter reference value from the other;

a control voltage generation circuit for delivering an analog control voltage corresponding to an integrated value of the difference value; and a voltage control oscillator circuit for delivering the output clock signal at a frequency corresponding to the analog control voltage, wherein the subtracter is capable of switching the subtracter reference value.

10. A clock multiplication circuit according to claim 9, wherein the subtracter comprises reference value storage means for storing the subtracter reference value, the reference value storage means configured so as to enable the subtracter reference value to be stored in the reference value storage means from outside.

11. A clock multiplication circuit for delivering an output clock signal at a frequency that is a multiple of the frequency of a reference clock signal as inputted, the clock multiplication circuit comprising:

a counter for delivering a total count value by counting the total number of effective transition edges of the output clock signal, existing during a predetermined counting period given on the basis of the reference clock signal;

a subtracter for delivering a difference value obtained by subtracting either the total count value or a reference value from the other;

a control voltage generation circuit for delivering an analog control voltage corresponding to an integrated value of the difference value obtained by adding a new difference value to the stored integrated value; and a voltage control oscillator circuit for delivering the output clock signal at a frequency corresponding to the analog control voltage, wherein the counter is a counter for delivering the total count value by counting the total number of the effective transition edges of the output clock signal, existing during the counting period when the reference clock signal is only at a Low level, and the counter, the subtracter, the control voltage generation circuit, and the voltage control oscillator circuit having response characteristics such that when the total count value is changed from a preceding count value, the frequency of the output clock signal is changed during a period in which the reference clock signal is a High level, after the end of the counting period and before the start of a succeeding counting period.

* * * * *